(12) United States Patent
Liao

(10) Patent No.: US 11,387,213 B2
(45) Date of Patent: Jul. 12, 2022

(54) METHOD FOR MANUFACTURING A SEMICONDUCTOR PACKAGE

(71) Applicant: Advanced Semiconductor Engineering, Inc., Kaohsiung (TW)

(72) Inventor: Shun Sing Liao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 32 days.

(21) Appl. No.: 16/894,630

(22) Filed: Jun. 5, 2020

(65) Prior Publication Data

US 2021/0384157 A1  Dec. 9, 2021

(51) Int. Cl.
*H01L 21/78* (2006.01)
*H01L 23/00* (2006.01)
(Continued)

(52) U.S. Cl.
CPC ............ *H01L 24/97* (2013.01); *H01L 21/561* (2013.01); *H01L 21/565* (2013.01); *H01L 21/78* (2013.01); *H01L 23/49838* (2013.01); *H01L 24/83* (2013.01); *H01L 24/85* (2013.01); *H01L 24/92* (2013.01); *H01L 23/49827* (2013.01); *H01L 24/32* (2013.01); *H01L 24/48* (2013.01);
(Continued)

(58) Field of Classification Search
CPC ....... H01L 24/97; H01L 24/92; H01L 21/561; H01L 21/565; H01L 23/49838; H01L 21/78; H01L 24/83; H01L 24/85; H01L 2224/32225; H01L 24/32; H01L 2924/3511; H01L 24/73; H01L 2224/48106; H01L 2224/48227; H01L 2224/73265; H01L 2224/48091; H01L 24/48; H01L 2224/98; H01L 23/49827
USPC ......................................... 438/113
See application file for complete search history.

(56) References Cited

U.S. PATENT DOCUMENTS 5,914,531 A * 6/1999 Tsunoda ............ H01L 23/3107
                                            257/668
8,102,027 B2 * 1/2012 Zhao .................. H01L 23/585
                                            257/620
(Continued)

FOREIGN PATENT DOCUMENTS

TW   201907487 A   2/2019
TW   201917844 A   5/2019

OTHER PUBLICATIONS

Office Action for corresponding Taiwanese Patent Application No. 110111508, dated May 10, 2022, 4 pages.
(Continued)

*Primary Examiner* — Vu A Vu
(74) *Attorney, Agent, or Firm* — Foley & Lardner LLP

(57) ABSTRACT

A method for manufacturing a semiconductor package includes: (a) providing a substrate structure, wherein the substrate structure includes a chip attach area, a bottom area opposite to the chip attach area, a lower side rail surrounding the bottom area, a first lower structure and a second lower structure, wherein the first lower structure is disposed in a first lower region of the lower side rail, and a second lower occupancy ratio is greater than a first lower occupancy ratio; (b) attaching at least one semiconductor chip to the chip attach area; and (c) forming an encapsulant to cover the at least one semiconductor chip.

20 Claims, 36 Drawing Sheets

(51) Int. Cl.
*H01L 21/56* (2006.01)
*H01L 23/498* (2006.01)

(52) U.S. Cl.
CPC .... *H01L 24/73* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H01L 2224/98* (2013.01); *H01L 2924/3511* (2013.01)

(56) References Cited

U.S. PATENT DOCUMENTS

| | | |
|---|---|---|
| 2019/0088687 A1 | 3/2019 | Yamazaki et al. |
| 2019/0348382 A1 | 11/2019 | Bodea et al. |
| 2020/0083130 A1 | 3/2020 | Tsao et al. |

OTHER PUBLICATIONS

Search Report (with English translation) for corresponding Taiwanese Patent Application No. 110111508, dated May 10, 2022, 2 pages.

* cited by examiner

METHOD FOR MANUFACTURING A SEMICONDUCTOR PACKAGE

BACKGROUND

1. Technical Field

The present disclosure generally relates to a substrate structure and a method for manufacturing a semiconductor package, and to a substrate structure having less warpage, and a method for manufacturing a semiconductor package by using the same.

2. Description of the Related Art

Design trends in the semiconductor industry include weight reduction and miniaturization of semiconductor products. However, techniques for weight reduction and miniaturization may result in manufacturing problems. For example, a thin semiconductor substrate is difficult to handle due to a large warpage. As a result, a yield rate of the semiconductor products is low. Thus, reduction in warpage of the semiconductor substrate during the manufacturing process is a critical issue.

SUMMARY

In accordance with an aspect of the present disclosure, a method for manufacturing a semiconductor package includes: (a) providing a substrate structure, wherein the substrate structure includes a chip attach area, a bottom area opposite to the chip attach area, a lower side rail surrounding the bottom area, a first lower structure and a second lower structure, wherein the first lower structure is disposed in a first lower region of the lower side rail, a first lower occupancy ratio is defined as a ratio of an area of the first lower structure from a bottom view to an area of the entire first lower region from a bottom view, the second lower structure is disposed in a second lower region surrounding the first lower region, a second lower occupancy ratio is defined as a ratio of an area of the second lower structure from a bottom view to an area of the entire second lower region from a bottom view, and the second lower occupancy ratio is greater than the first lower occupancy ratio; (b) attaching at least one semiconductor chip to the chip attach area; and (c) forming an encapsulant to cover the at least one semiconductor chip.

In accordance with an aspect of the present disclosure, a method for manufacturing a semiconductor package includes: (a) providing a substrate structure, wherein the substrate structure includes a chip attach area, a bottom area opposite to the chip attach area, a first lower structure and a second lower structure, wherein the first lower structure is disposed in a first lower region surrounding the bottom area, the second lower structure is disposed in a second lower region surrounding the first lower region, wherein a width of the second lower region is greater than a width of the first lower region, a second lower occupancy ratio is defined as a ratio of an area of the second lower structure from a bottom view to an area of the entire second lower region from a bottom view, and the second lower occupancy ratio is greater than 80%; (b) attaching at least one semiconductor chip to the chip attach area; and (c) forming an encapsulant to cover the at least one semiconductor chip.

In accordance with another aspect of the present disclosure, a method for manufacturing a semiconductor package includes: (a) providing a substrate structure, wherein the substrate structure includes a chip attach area, an upper side rail surrounding the chip attach area, a first upper structure, a second upper structure, a bottom area opposite to the chip attach area, a lower side rail surrounding the bottom area, a first lower structure and a second lower structure, wherein the first upper structure is disposed in a first upper region of the upper side rail, the second upper structure is disposed in a second upper region surrounding the first upper region, the first lower structure is disposed in a first lower region of the lower side rail, the second lower structure is disposed in a second lower region surrounding the first lower region, wherein a stress relieving ability of the first lower structure is less than a stress relieving ability of the first upper structure, and a structural strength of the second lower structure is greater than a structural strength of the second upper structure; (b) attaching at least one semiconductor chip to the chip attach area; and (c) forming an encapsulant to cover the at least one semiconductor chip.

Figure 1:
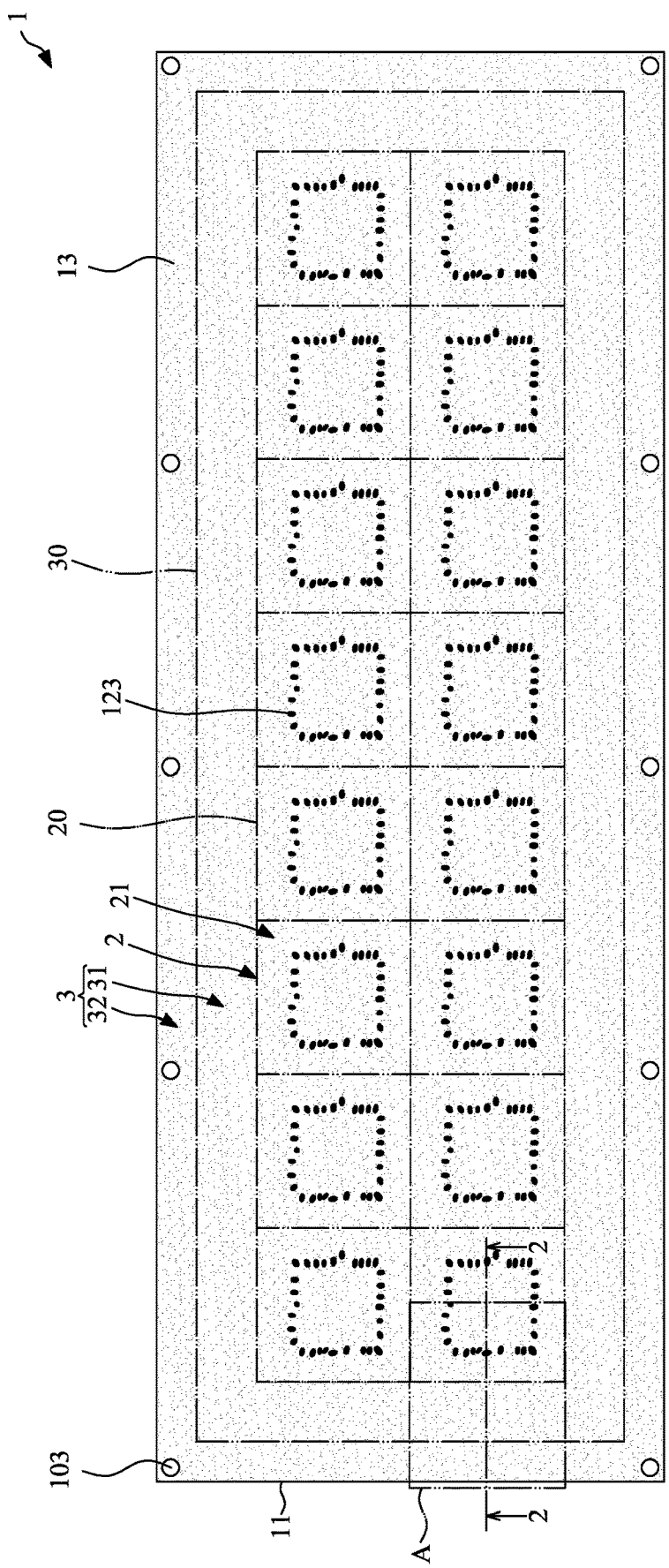
FIG. 1 illustrates a top view of a substrate structure in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 2:
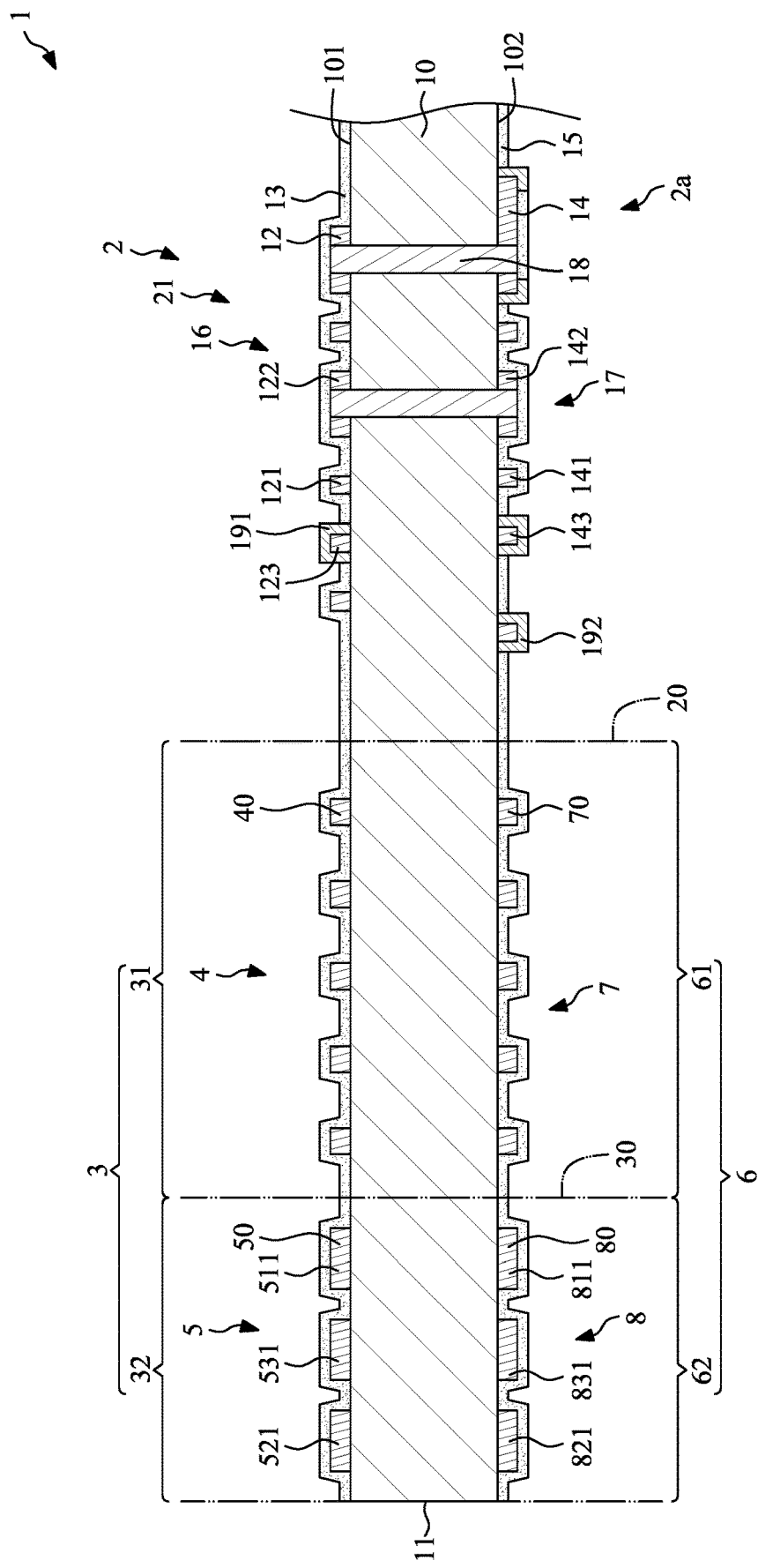
FIG. 2 illustrates an enlarged cross-sectional view taken along line 2-2 in a region "A" in FIG. 1.

FIG. 1 illustrates a top view of a substrate structure 1 in accordance with some embodiments of the present disclosure. FIG. 2 illustrates an enlarged cross-sectional view taken along line 2-2 in a region "A" in FIG. 1. The substrate structure 1 includes main body 10, a chip attach area 2, an upper side rail 3, an upper metal layer 16, a bottom layout area 2a, a lower side rail 6, a lower metal layer 17, an upper solder resist layer 13, a lower solder resist layer 15, a plurality of conductive vias 18 and a plurality of position holes 103. As shown in FIG. 1, the substrate structure 1 may be a strip type substrate; however, in other embodiments, the substrate structure 1 may be a panel type substrate.

The material of the main body 10 may be a dielectric material, which may include a glass reinforced epoxy material (such as FR4), bismaleimide triazine (BT), epoxy resin, silicon, printed circuit board (PCB) material, glass, ceramic or photoimageable dielectric (PID) material. The main body 10 has an upper surface 101 and a lower surface 102 opposite to the upper surface 101. The upper surface 101 of the main body 10 includes the chip attach area 2 and the upper side rail 3 surrounding the chip attach area 2. The upper side rail 3 may include a first region 31 surrounding the chip attach area 2, and a second region 32 surrounding the first region 31. There may be a second boundary line 30 between the second region 32 and the first region 31. In one embodiment, the second boundary line 30 may be an imaginary cutting line. It is to be noted that in some embodiments, the second boundary line 30 may be a solid line, that is, it may be an actual boundary.

The upper metal layer 16 is disposed adjacent to the upper surface 101 of the main body 10, and is a patterned metal layer that includes an upper circuit layer 12 disposed in the chip attach area 2, a first structure 4 (e.g., an upper stress relief structure) disposed in the first region 31, and a second structure 5 (e.g., an upper reinforcing structure) disposed in the second region 32. In some embodiments, the upper circuit layer 12, the first structure 4 (e.g., the upper stress relief structure) and the second structure 5 (e.g., the upper reinforcing structure) are disposed at the same layer, and are formed currently at a process stage. A material of the upper metal layer 16 (including the upper circuit layer 12, the first structure 4 (e.g., an upper stress relief structure) and the second structure 5 (e.g., an upper reinforcing structure)) may include a metal material such as copper, gold, aluminum, or other suitable metal. In one embodiment, the upper metal layer 16 may be the topmost metal layer, and there may be one or more metal layers disposed under the upper metal layer 16 and embedded in the main body 10.

The lower surface 102 of the main body 10 includes the bottom layout area 2a and the lower side rail 6 surrounding the bottom layout area 2a. The lower side rail 6 may include a third region 61 surrounding the bottom layout area 2a, and a fourth region 62 surrounding the third region 61. The lower metal layer 17 is disposed adjacent to the lower surface 102 of the main body 10, and is a patterned metal layer that includes a lower circuit layer 14 disposed in the bottom layout area 2a, a third structure 7 (e.g., a lower stress relief structure) disposed in the third region 61, and a fourth structure 8 (e.g., a lower reinforcing structure) disposed in the fourth region 62. In some embodiments, the lower circuit layer 14, the third structure 7 (e.g., a lower stress relief structure) and the fourth structure 8 (e.g., a lower reinforcing structure) are disposed at the same layer, and are formed currently at a process stage. A material of the lower metal layer 17 (including the lower circuit layer 14, the third structure 7 (e.g., a lower stress relief structure) and the fourth structure 8 (e.g., a lower reinforcing structure)) may include a metal material such as copper, gold, aluminum, or other suitable metal. In one embodiment, the lower metal layer 17 may be the bottommost metal layer, and there may be one or more metal layers disposed above the lower metal layer 17 and embedded in the main body 10.

The conductive vias 18 may extend through the main body 10. Thus, the upper circuit layer 12 is electrically connected to the lower circuit layer 14 through the conductive vias 18.

The chip attach area 2 is used for at least one semiconductor chip 92 (FIG. 32) to be disposed thereon. As shown in FIG. 1, the chip attach area 2 includes a plurality of unit areas 21. For example, 2*8=16 unit areas 21. Each of the unit areas 21 is defined by a plurality of first boundary lines 20 cross with each other, and is a place wherein at least one semiconductor chip 92 (FIG. 32) is disposed on. In one embodiment, the first boundary lines 20 may be an imaginary cutting line. It is to be noted that in some embodiments, the first boundary lines 20 may be solid lines, that is, they may be actual boundaries. In addition, after a subsequent molding process, a dicing process (or singulation process) may be performed along the first boundary lines 20, so that each of the unit areas 21 remains in each final product (i.e., the semiconductor package 9 (FIG. 28)).

The upper solder resist layer 13 is disposed on the upper surface 101 of the main body 10 to cover at least a portion of the upper metal layer 16. The lower solder resist layer 15 is disposed on the lower surface 102 of the main body 10 to cover at least a portion of the lower metal layer 17. The position holes 103 extend through the substrate structure 1 and are used for position pins to be inserted therein. Thus, the position of the substrate structure 1 is ensured during the subsequent manufacturing process.

Figure 3:
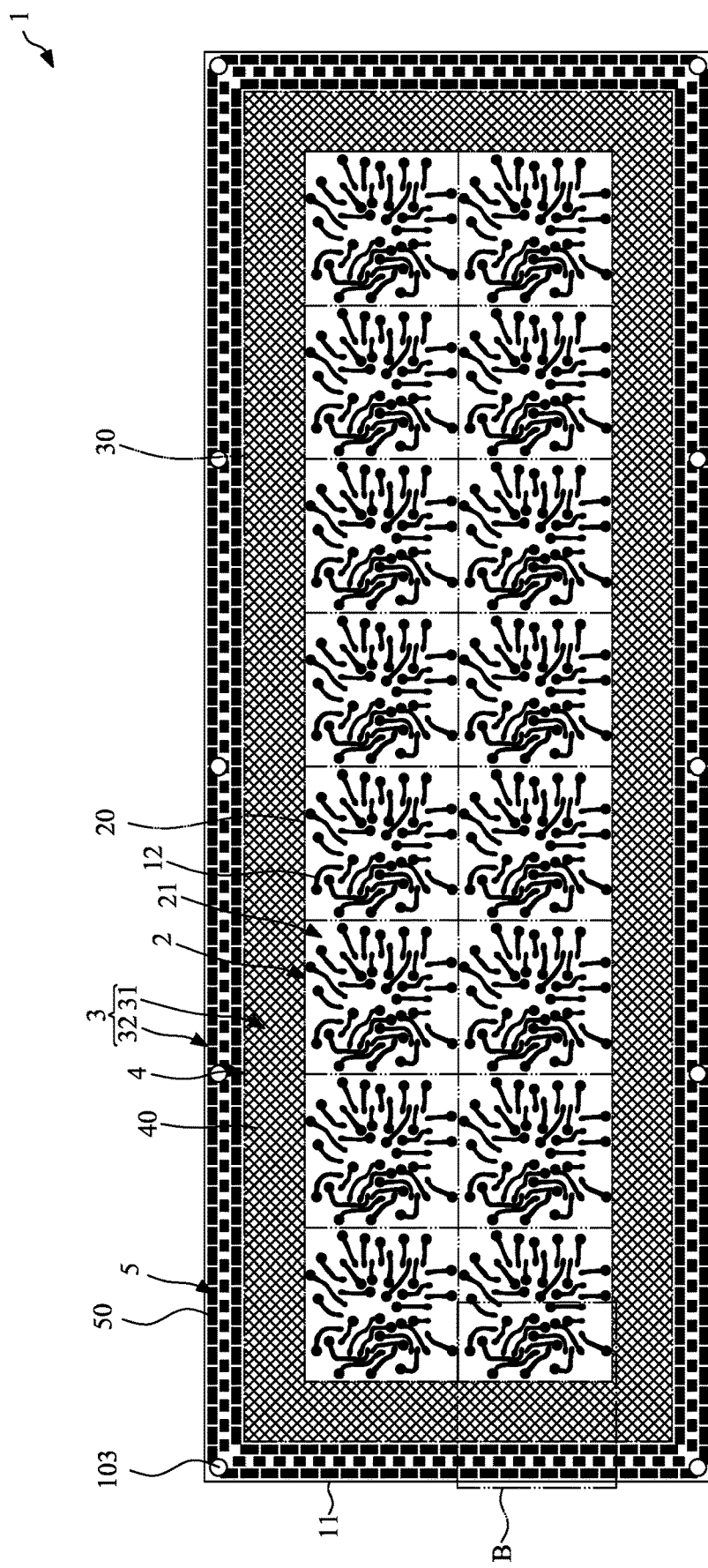
FIG. 3 illustrates a top view of the substrate structure of FIG. 1, wherein an upper solder resist layer and a lower solder resist layer are omitted for clarity of illustration.

FIG. 3 illustrates a top view of the substrate structure 1 of FIG. 1, wherein the upper solder resist layer 13 and the lower solder resist layer 15 are omitted for clarity of illustration. As shown in FIG. 3, the upper circuit layer 12 may be disposed in each of the unit areas 21, the first structure 4 (e.g., the upper stress relief structure) may be disposed in the first region 31, and the second structure 5 (e.g., the upper reinforcing structure) may be disposed in the second region 32. Thus, the first structure 4 (e.g., the upper stress relief structure) surrounds the chip attach area 2, and the second structure 5 (e.g., the upper reinforcing structure) surrounds the first structure 4 (e.g., the upper stress relief structure). The first structure 4 (e.g., the upper stress relief structure) is disposed between the chip attach area 2 and the second structure 5 (e.g., the upper reinforcing structure).

Figure 4:
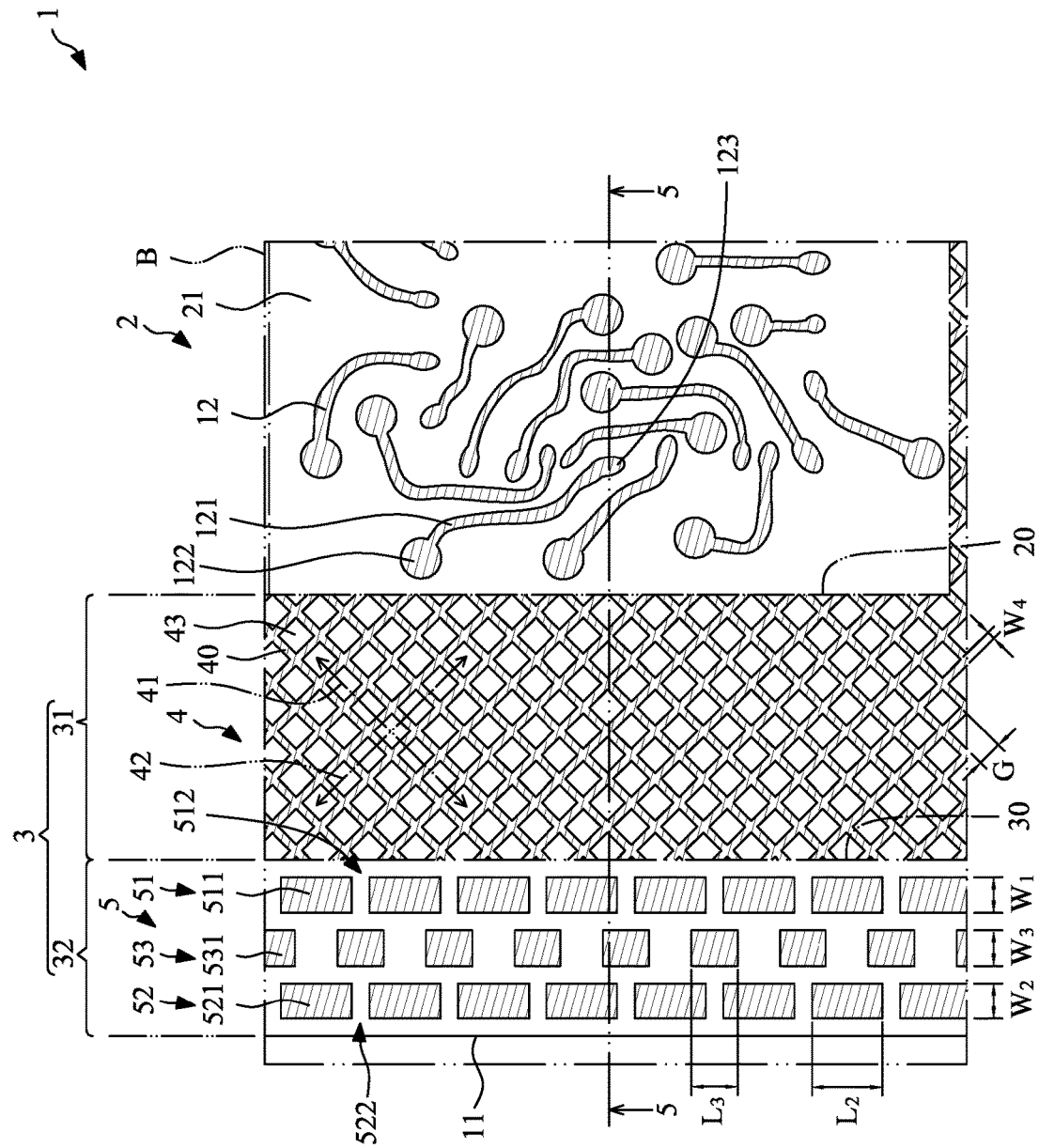
FIG. 4 illustrates an enlarged view of a region "B" in FIG. 3.
Figure 5:
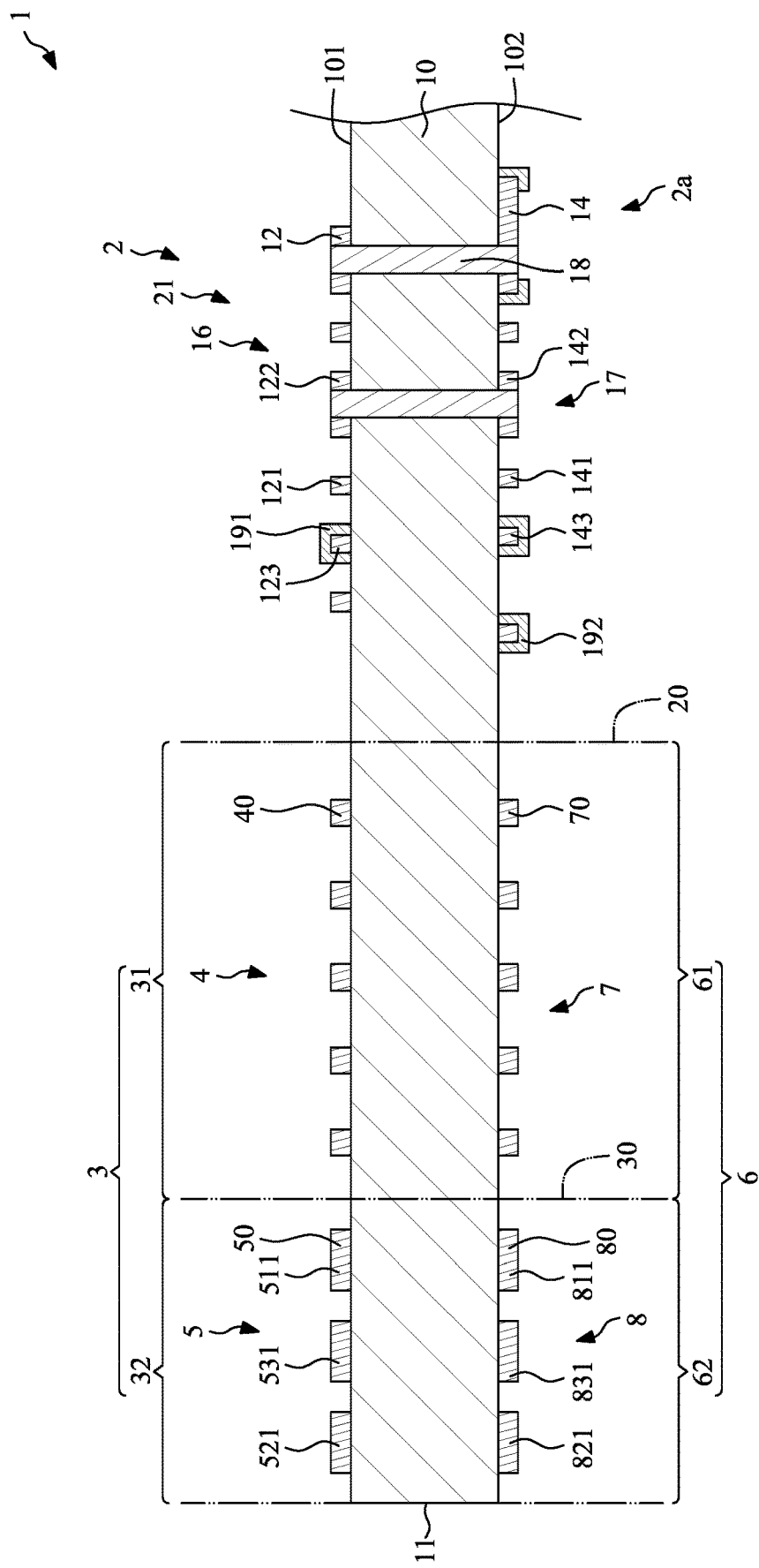
FIG. 5 illustrates an enlarged cross-sectional view taken along line 5-5 in FIG. 4.

FIG. 4 illustrates an enlarged view of a region "B" in FIG. 3. FIG. 5 illustrates an enlarged cross-sectional view taken along line 5-5 in FIG. 4. The upper circuit layer 12 may include a plurality of conductive traces 121, a plurality of conductive pads 122, and a plurality of conductive fingers 123. In some embodiments, the layouts of the upper circuit layers 12 in all of the unit areas 21 may be same with each other. In an embodiment, the conductive finger 123 may have an upper surface finish layer 191, such as an electroplated gold layer or a tin plating layer. It is understood that the upper surface finish layer 191 may be omitted. A material of the upper circuit layer 12 includes a metal material, the upper stress relief structure includes a metal material, and a material of the upper reinforcing structure includes a metal material. Similarly, the lower circuit layer 14 may include a plurality of conductive traces 141, a plurality of conductive pads 142, and a plurality of external connectors 143 (e.g., ball pads). In an embodiment, the external connector 143 may have a lower surface finish layer 192, such as an electroplated gold layer or a tin plating layer. A material of the lower circuit layer 14 may be same as the material of the upper circuit layer 12.

The first structure 4 (e.g., the upper stress relief structure) may be physically connected to the second structure 5 (e.g., the upper reinforcing structure). Alternatively, the first structure 4 (e.g., the upper stress relief structure) may be physically separated from the second structure 5 (e.g., the upper reinforcing structure). The first structure 4 (e.g., the upper stress relief structure) and the second structure 5 (e.g., the upper reinforcing structure) may have different functions. For example, the first structure 4 (e.g., the upper stress relief structure) may be used for releasing the stress of the substrate structure 1 so as to reduce the residual stress in the substrate structure 1. That is, a stress relieving ability of the first structure 4 (e.g., the upper stress relief structure) is greater than a stress relieving ability of the second structure 5 (e.g., the upper reinforcing structure). Further, the second structure 5 (e.g., the upper reinforcing structure) may be used for providing rigidity and stiffness so as to resist a deformation of the substrate structure 1. That is, a structural strength of the second structure 5 (e.g., the upper reinforcing structure) is greater than a structural strength of the first structure 4 (e.g., the upper stress relief structure). The above-mentioned two functions may reduce the warpage of the substrate structure 1 during the manufacturing process.

A pattern of the first structure 4 (e.g., the upper stress relief structure) may be the same as or different from a pattern of the second structure 5 (e.g., the upper reinforcing structure). As shown in FIG. 4, the pattern of the first structure 4 (e.g., the upper stress relief structure) is in a net shape from a top view. In one embodiment, the first structure 4 (e.g., the upper stress relief structure) includes a plurality of strips 40 cross with each other to form the net shape. A width $W_4$ of each of the strips 40 may be about 0.1 millimeter (mm) to about 0.7 mm. A gap G between two adjacent strips 40 may be about 0.4 mm to about 2.0 mm. Since the pattern of the first structure 4 (e.g., the upper stress relief structure) may be in a grid shape, and the strips 40 are not parallel with an edge 11 of the substrate structure 1, most of the stress in the substrate structure 1 may be released through the first structure 4 (e.g., the upper stress relief structure) readily. As shown in FIG. 4, the strips 40 define a plurality of empty holes 43 arranged along two directions (e.g., a first direction 41 and a second direction 42). The two directions (e.g., a first direction 41 and a second direction 42) are neither perpendicular to nor parallel with the edge 11 of the substrate structure 1. Thus, the two directions (e.g., a first direction 41 and a second direction 42) are stress relief directions of the first structure 4 (e.g., the upper stress relief structure). The first structure 4 (e.g., the upper stress relief structure) may have at least two stress relief directions.

The second structure 5 (e.g., the upper reinforcing structure) may include at least one row of segments 50 substantially parallel with the edge 11 of the substrate structure 1. As shown in FIG. 4, the second structure 5 (e.g., the upper reinforcing structure) may include three parallel rows of the segments 50 such as an innermost row 51 of first segments 511, an outermost row 52 of second segments 521 and an intermediate row 53 of third segments 531. The shape of each of the segments 50 (e.g., the first segments 511, the second segments 521 and the third segments 531) may be rectangular or square. A size of each of the first segments 511 is substantially equal to a size of each of the second segments 521, and a size of each of the third segments 531 is different from the size of each of the first segments 511. For example, a width $W_1$ of the first segment 511 may be equal to a width $W_2$ of the second segments 521, which may be about 1 mm to about 2 mm. A width $W_3$ of the third segment 531 may be equal to the width $W_2$ of the second segments 521, which may be about 1 mm to about 2 mm. It is noted that the width of the segments 50 (e.g., the width $W_1$ of the first segment 511, the width $W_2$ of the second segments 521 and the width $W_3$ of the third segment 531) is greater than a gap between the innermost row 51 and the intermediate row 53, or a gap between the outermost row 52 and the intermediate row 53 of third segments 531. Further, a length of the first segment 511 may be equal to a length $L_2$ of the second segments 521, which may be about 2 mm to 4 mm. A length $L_3$ of the third segment 531 may be about 1 mm to about 2 mm, which may be less than the length $L_2$ of the second segments 521.

In addition, the first segments 511 are aligned with the second segments 521, and the third segments 531 are misaligned with the first segments 511 and the second segments 521. For example, two adjacent first segments 511 define a first gap 512, two adjacent second segments 521 define a second gap 522, and a center of the third segment 531 is disposed between the first gap 512 and the second gap 522. In one embodiment, the first gap 512 may be equal to the second gap 522, which may be about 0.1 mm to 0.7 mm.

Since a width of the segments 50 (e.g., the width $W_1$ of the first segment 511, the width $W_2$ of the second segments 521 and the width $W_3$ of the third segment 531) is greater than the width $W_4$ of each of the strips 40, and the segments 50 (e.g., the first segment 511, the second segments 521 and the third segment 531) are arranged in parallel with the edge 11 of the substrate structure 1, the second structure 5 (e.g., the upper reinforcing structure) may be a rigid and stiff structure.

As shown in FIG. 3 and FIG. 4, a first occupancy ratio is defined as a ratio of an area of a solid portion of the first structure 4 (e.g., the upper stress relief structure) from a top view to an area of the entire first region 31 from a top view. A second occupancy ratio is defined as a ratio of an area of a solid portion of the second structure 5 (e.g., the upper reinforcing structure) from a top view to an area of the entire second region 32 from a top view. The second occupancy ratio may be different from the first occupancy ratio. For example, the second occupancy ratio may be greater than the first occupancy ratio. In one embodiment, the first structure 4 (e.g., the upper stress relief structure) includes copper; thus, the first occupancy ratio is a first residual copper ratio. Similarly, the second structure 5 (e.g., the upper reinforcing structure) includes copper; thus, the second occupancy ratio is a second residual copper ratio. Therefore, the second residual copper ratio of the second structure 5 (e.g., the upper reinforcing structure) is greater than the first residual copper ratio of the first structure 4 (e.g., the upper stress relief structure).

Figure 6:
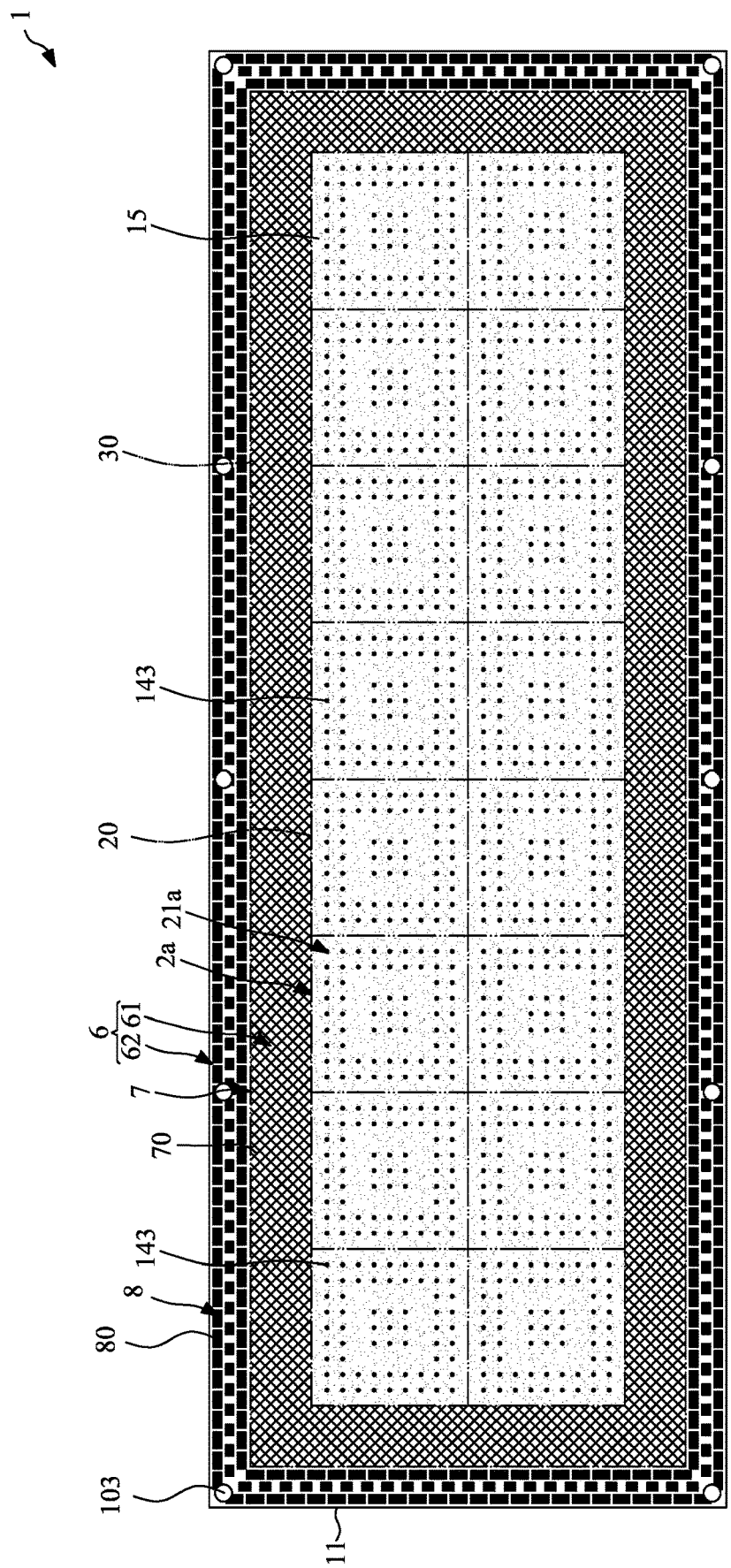
FIG. 6 illustrates a bottom view of the substrate structure of FIG. 1, wherein a portion of a lower solder resist layer that covers the lower side rail is omitted for clarity of illustration.

FIG. 6 illustrates a bottom view of the substrate structure 1 of FIG. 1, wherein a portion of the lower solder resist layer 15 that covers the lower side rail 6 is omitted for clarity of illustration. The bottom layout area 2a corresponds to the chip attach area 2 of FIG. 3. As shown in FIG. 6, the bottom layout area 2a includes a plurality of unit areas 21a. Each of the unit areas 21a corresponds to each of the unit areas 21, and is also defined by the first boundary lines 20.

As shown in FIG. 2, FIG. 3 and FIG. 6, the third structure 7 (e.g., a lower stress relief structure) may correspond to the first structure 4 (e.g., the upper stress relief structure). A pattern of the third structure 7 (e.g., a lower stress relief structure) may be the same as the pattern of the first structure 4 (e.g., the upper stress relief structure). That is, the pattern of the third structure 7 (e.g., a lower stress relief structure) may include a plurality of strips 70 cross with each other to form a net shape.

The fourth structure 8 (e.g., a lower reinforcing structure) may corresponds to the second structure 5 (e.g., the upper reinforcing structure). A pattern of the fourth structure 8 (e.g., a lower reinforcing structure) may the same as the pattern of the second structure 5 (e.g., the upper reinforcing structure). That is, the fourth structure 8 (e.g., a lower reinforcing structure) may include at least one row of segments 80 substantially parallel with the edge 11 of the substrate structure 1. As shown in FIG. 2, the fourth structure 8 (e.g., a lower reinforcing structure) may include three parallel rows of the segments 80 such as an innermost row of first segments 811, an outermost row of second segments 821 and an intermediate row of third segments 831. The size and shape of each of the segments 80 (e.g., the first segments 811, the second segments 821 and the third segments 831) may be substantially equal to the size and shape of each of the segments 50 (e.g., the first segments 511, the second segments 521 and the third segments 531).

The third structure 7 (e.g., a lower stress relief structure) and the fourth structure 8 (e.g., a lower reinforcing structure) may have different functions. For example, the third structure 7 (e.g., a lower stress relief structure) may be used for releasing the stress of the substrate structure 1. That is, a stress relieving ability of the third structure 7 (e.g., a lower stress relief structure) is greater than a stress relieving ability of the fourth structure 8 (e.g., a lower reinforcing structure). Further, the fourth structure 8 (e.g., a lower reinforcing structure) may be used for providing rigidity and stiffness. That is, a structural strength of the fourth structure 8 (e.g., a lower reinforcing structure) is greater than a structural strength of the third structure 7 (e.g., a lower stress relief structure).

As shown in FIG. 5 and FIG. 6, a third occupancy ratio is defined as a ratio of an area of a solid portion of the third structure 7 (e.g., the lower stress relief structure) from a bottom view to an area of the entire third region 61 from a bottom view. A fourth occupancy ratio is defined as a ratio of an area of a solid portion of the fourth structure 8 (e.g., the lower reinforcing structure) from a bottom view to an area of the entire fourth region 62 from a bottom view. The fourth occupancy ratio may be different from the third occupancy ratio. For example, the fourth occupancy ratio may be greater than the third occupancy ratio. In one embodiment, the third structure 7 (e.g., the lower stress relief structure) includes copper; thus, the third occupancy ratio is a residual copper ratio. Similarly, the fourth structure 8 (e.g., the lower reinforcing structure) includes copper; thus, the fourth occupancy ratio is a residual copper ratio. Therefore, the residual copper ratio of the fourth structure 8 (e.g., the lower reinforcing structure) is greater than the residual copper ratio of the third structure 7 (e.g., the lower stress relief structure).

As shown in FIG. 5 and FIG. 6, a size of the lower side rail 6 is substantially equal to a size of the upper side rail 3. The sizes of the third region 61 and the fourth region 62 are substantially equal to the sizes of the first region 31 and the second region 32, respectively. Thus, a size of the third structure 7 (e.g., a lower stress relief structure) of the lower side rail 6 is substantially equal to a size of the first structure 4 (e.g., the upper stress relief structure) of the upper side rail 3, and a size of the fourth structure 8 (e.g., a lower reinforcing structure) of the lower side rail 6 is substantially equal to a size of the second structure 5 (e.g., the upper reinforcing structure) of the upper side rail 3. However, in other embodiment, the size of the lower side rail 6 may be different from the size of the upper side rail 3. The sizes of the third region 61 and the fourth region 62 may be different from the sizes of the first region 31 and the second region 32, respectively. Thus, the size of the third structure 7 (e.g., a lower stress relief structure) of the lower side rail 6 may be different from the size of the first structure 4 (e.g., the upper stress relief structure) of the upper side rail 3, and the size of the fourth structure 8 (e.g., a lower reinforcing structure) of the lower side rail 6 may be different from the size of the second structure 5 (e.g., the upper reinforcing structure) of the upper side rail 3.

In the embodiment illustrated in FIG. 1 to FIG. 6, an upper overall residual metal ratio is defined as a ratio of an area of the upper metal layer 16 (including the upper circuit layer 12, the first structure 4 (e.g., the upper stress relief structure) and the second structure 5 (e.g., the upper reinforcing structure)) from a top view to an area of the entire upper surface 101 of the main body 10. Since the upper metal layer 16 may include copper; thus, the upper overall residual metal ratio is an upper overall residual copper ratio. It is noted that the upper overall residual metal ratio (e.g., the upper overall residual copper ratio) may be adjusted by adjusting the first occupancy ratio (the first residual copper ratio) of the first structure 4 (e.g., the upper stress relief structure) and the second occupancy ratio (the second residual copper ratio) of the second structure 5 (e.g., the upper reinforcing structure). Similarly, a lower overall residual metal ratio is defined as a ratio of an area of the lower metal layer 17 (including the lower circuit layer 14, the third structure 7 (e.g., the lower stress relief structure) and the fourth structure 8 (e.g., the lower reinforcing structure)) from a bottom view to an area of the entire lower surface 102 of the main body 10. Since the lower metal layer 17 may include copper; thus, the lower overall residual metal ratio is a lower overall residual copper ratio. It is noted that the lower overall residual metal ratio (e.g., the lower overall residual copper ratio) may be adjusted by adjusting the third occupancy ratio (the third residual copper ratio) of the third structure 7 (e.g., the lower stress relief structure) and the fourth occupancy ratio (the fourth residual copper ratio) of the fourth structure 8 (e.g., the lower reinforcing structure). Therefore, a difference between the upper overall residual metal ratio and the overall lower residual metal ratio may be adjusted to be less than or equal to about 4%, about 3%, about 2%, about 1%, or about 0. As a result, a warpage of the substrate structure 1 is reduced.

In addition, an upper solder resist cover ratio is defined as a ratio of an area of the upper solder resist layer 13 from a top view to an area of the entire upper surface 101 of the main body 10. The upper solder resist cover ratio is adjustable. Similarly, a lower solder resist cover ratio is defined as a ratio of an area of the lower solder resist layer 15 from a bottom view to an area of the entire lower surface 102 of the main body 10. The lower solder resist cover ratio is adjustable. Thus, a difference between the upper solder resist cover ratio and the lower solder resist cover ratio may be adjusted to be less than or equal to about 5%, about 4%, about 3%, about 2%, about 1%, or about 0. As a result, a warpage of the substrate structure 1 is further reduced.

Figure 7:
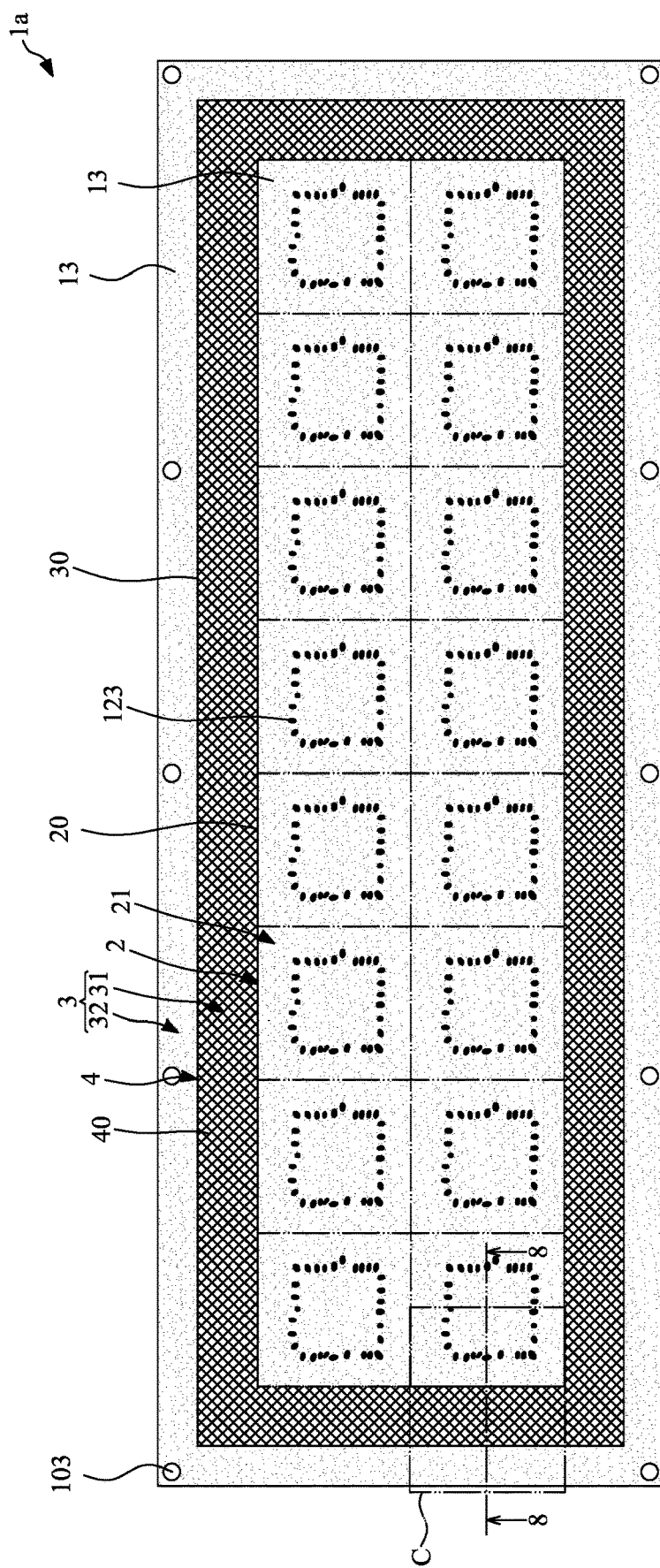
FIG. 7 illustrates a top view of a substrate structure in accordance with some embodiments of the present disclosure.
Figure 8:
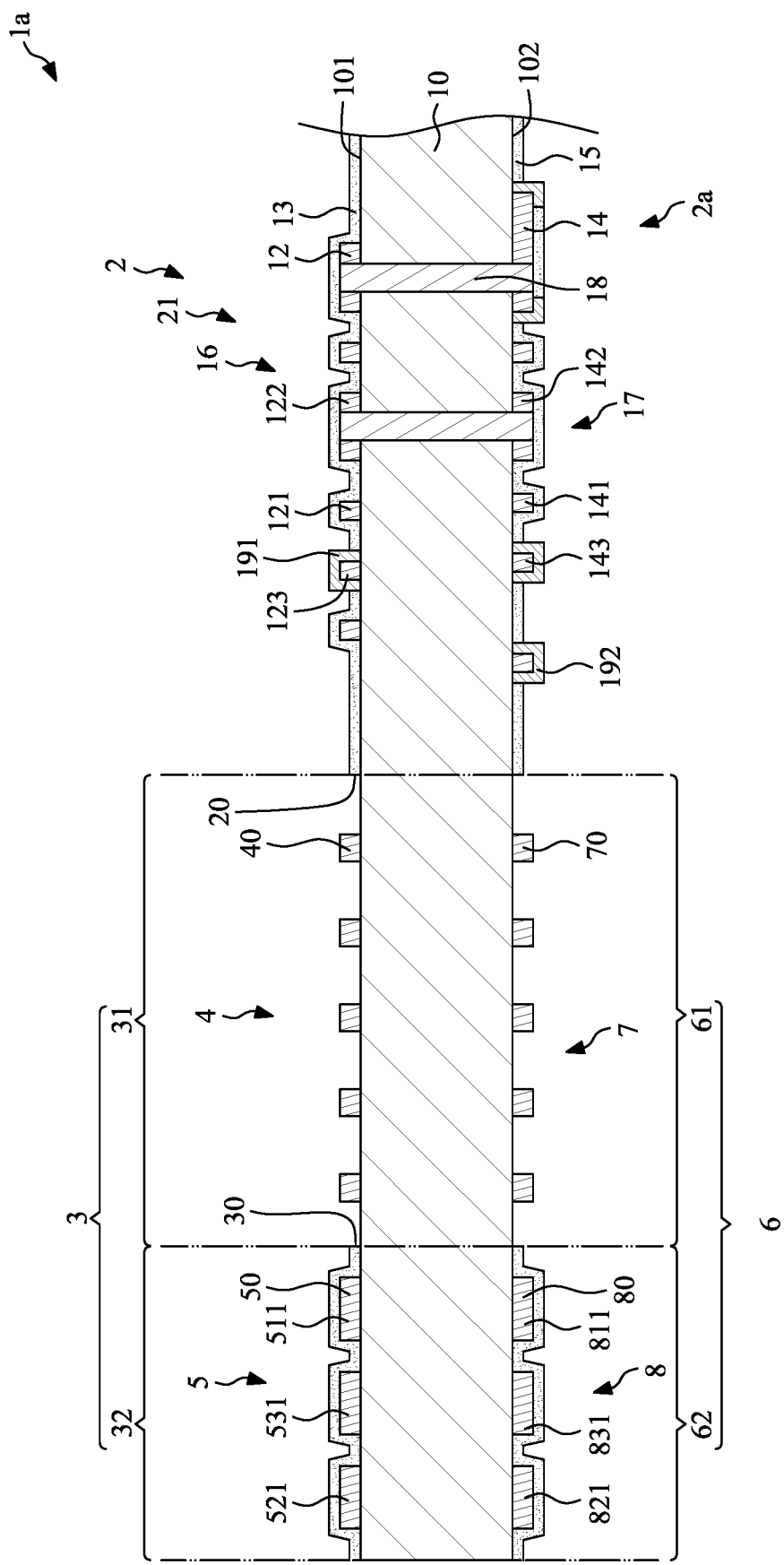
FIG. 8 illustrates an enlarged cross-sectional view taken along line 8-8 in a region "C" in FIG. 7.

FIG. 7 illustrates a top view of a substrate structure 1a in accordance with some embodiments of the present disclosure. FIG. 8 illustrates an enlarged cross-sectional view taken along line 8-8 in a region "C" in FIG. 7. The substrate structure 1a is similar to the substrate structure 1 in FIG. 1 to FIG. 6 except for structures of the upper solder resist layer 13 and the lower solder resist layer 15. As shown in FIG. 7 and FIG. 8, the upper solder resist layer 13 covers the upper circuit layer 12 and the second structure 5 (e.g., the upper reinforcing structure), but does not cover the first structure 4 (e.g., the upper stress relief structure). That is, the upper solder resist layer 13 uncovers the first structure 4 (e.g., the upper stress relief structure). Similarly, the lower solder resist layer 15 covers the lower circuit layer 14 and the fourth structure 8 (e.g., the lower reinforcing structure), but does not cover the third structure 7 (e.g., the lower stress relief structure). That is, the lower solder resist layer 15 uncovers the third structure 7 (e.g., the lower stress relief structure).

Figure 9:
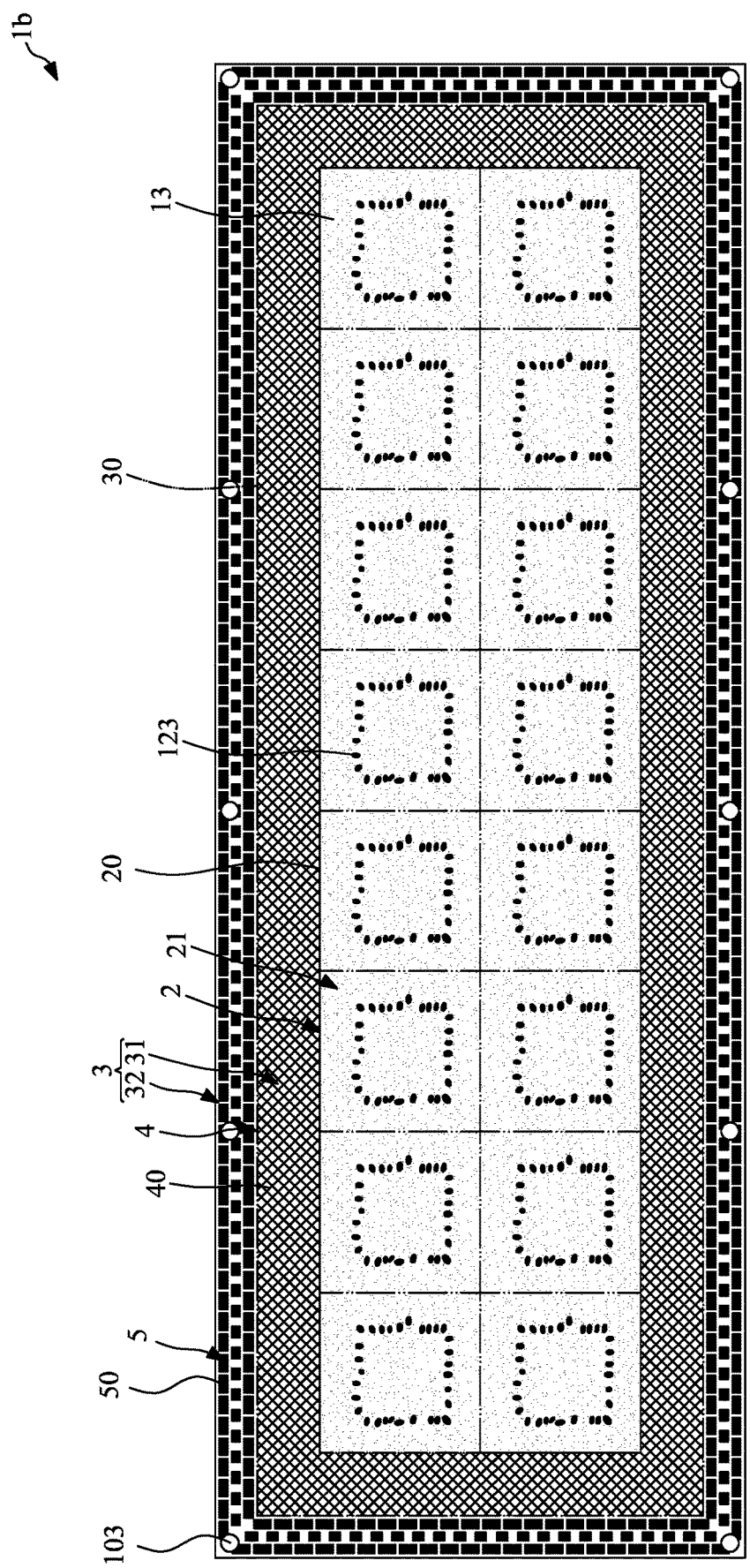
FIG. 9 illustrates a top view of a substrate structure in accordance with some embodiments of the present disclosure.

FIG. 9 illustrates a top view of a substrate structure 1b in accordance with some embodiments of the present disclosure. The substrate structure 1b is similar to the substrate structure 1 in FIG. 1 to FIG. 6 except for structures of the upper solder resist layer 13 and the lower solder resist layer 15. As shown in FIG. 9, the upper solder resist layer 13 covers the upper circuit layer 12, but does not cover the first structure 4 (e.g., the upper stress relief structure) and the second structure 5 (e.g., the upper reinforcing structure). That is, the upper solder resist layer 13 uncovers the first structure 4 (e.g., the upper stress relief structure) and the second structure 5 (e.g., the upper reinforcing structure). Similarly, the lower solder resist layer 15 covers the lower circuit layer 14, but does not cover the third structure 7 (e.g., the lower stress relief structure) and the fourth structure 8 (e.g., the lower reinforcing structure). That is, the lower solder resist layer 15 uncovers the third structure 7 (e.g., the lower stress relief structure) and the fourth structure 8 (e.g., the lower reinforcing structure).

Figure 10:
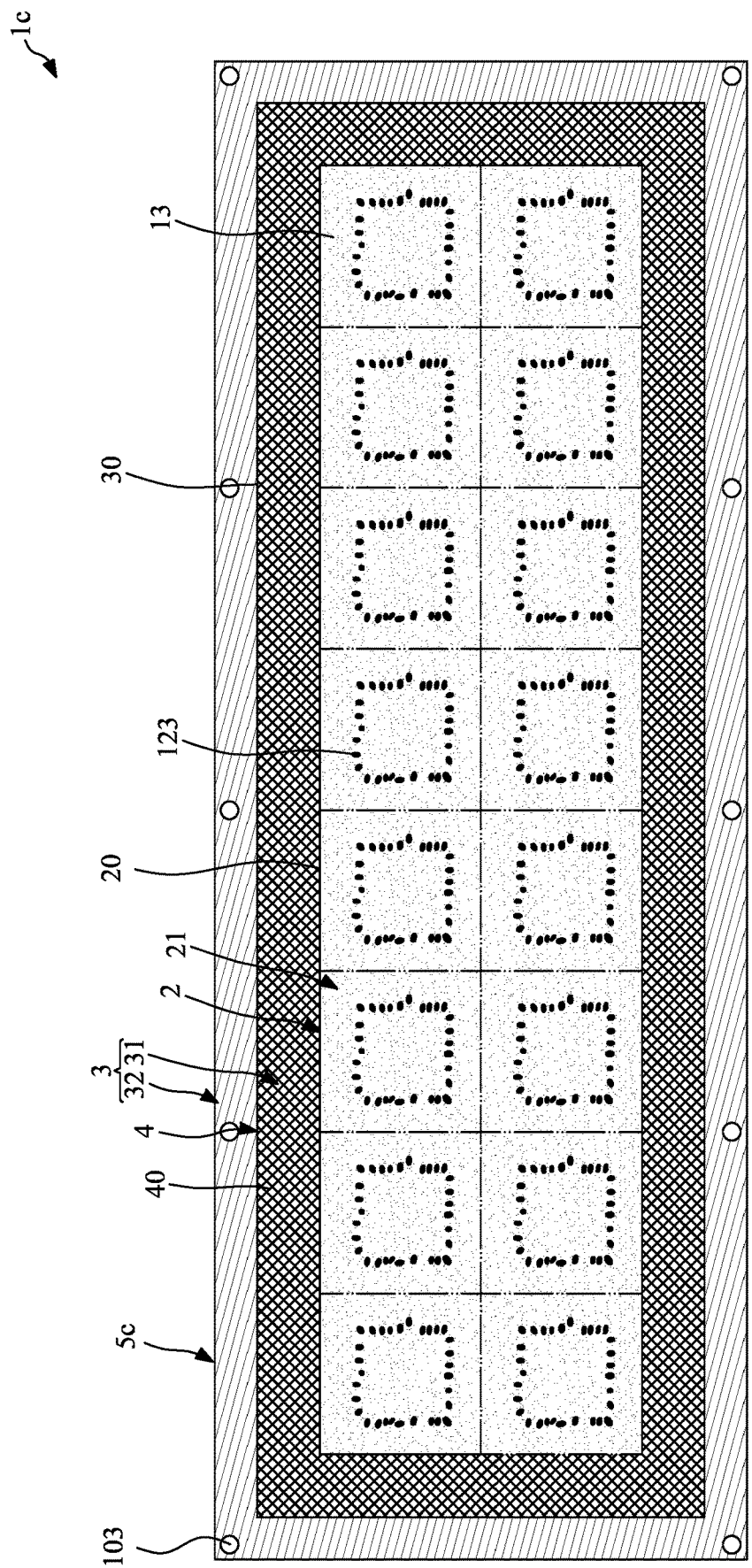
FIG. 10 illustrates a top view of a substrate structure in accordance with some embodiments of the present disclosure.

FIG. 10 illustrates a top view of a substrate structure 1c in accordance with some embodiments of the present disclosure. The substrate structure 1c is similar to the substrate structure 1b in FIG. 9 except for a structure of the second structure 5c (e.g., the upper reinforcing structure). As shown in FIG. 10, the pattern of the second structure 5c (e.g., the upper reinforcing structure) is in a continuous ring shape from a top view. That is, the second region 32 of the upper side rail 3 is full of a metal material. The shape and size of the second structure 5c (e.g., the upper reinforcing structure) are conformal with the shape and size of the second region 32 of the upper side rail 3. Further, the first structure 4 (e.g., the upper stress relief structure) is physically connected to the second structure 5c (e.g., the upper reinforcing structure).

Figure 11:
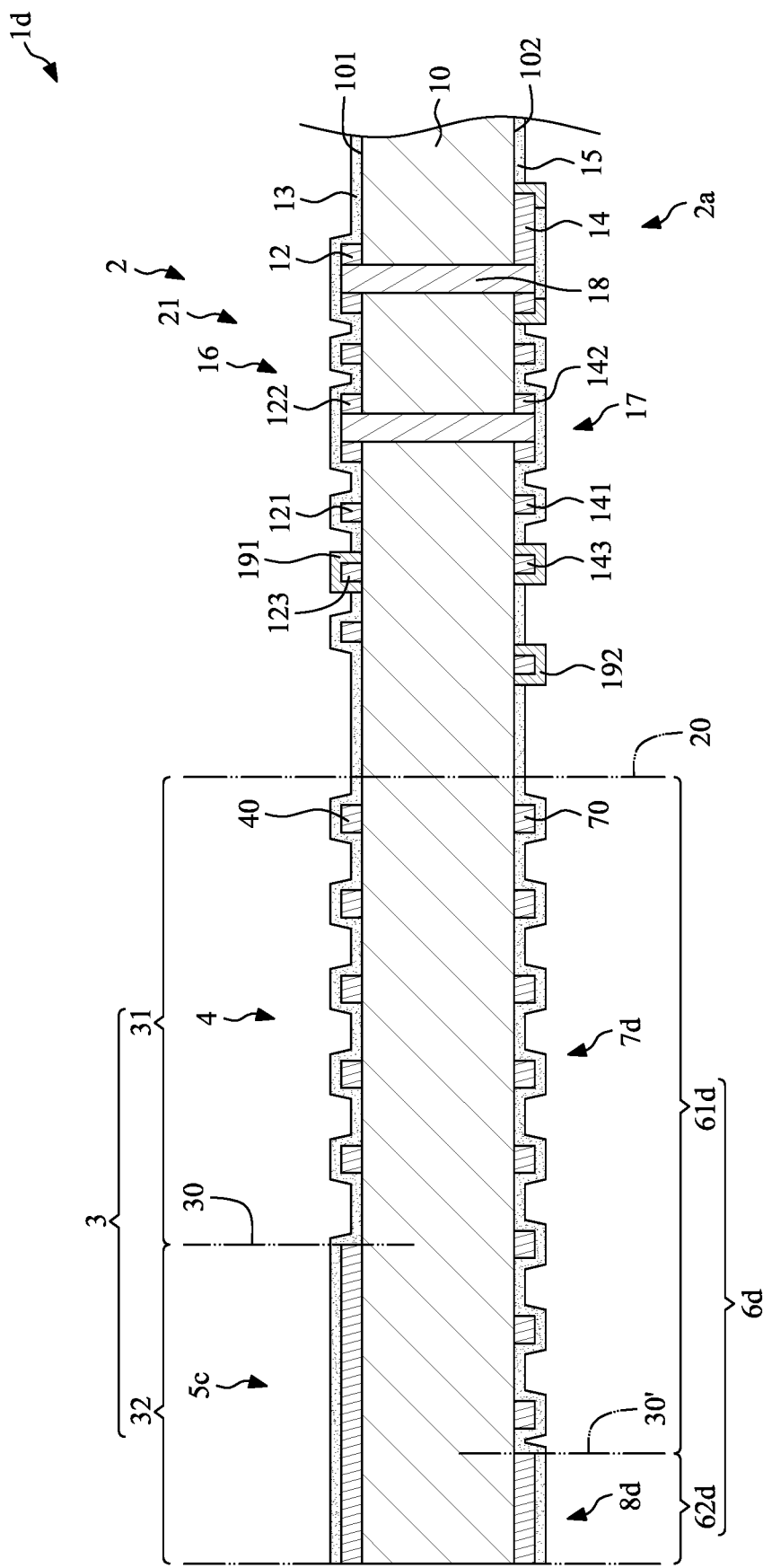
FIG. 11 illustrates an enlarged cross-sectional view of a substrate structure in accordance with some embodiments of the present disclosure.
Figure 12:
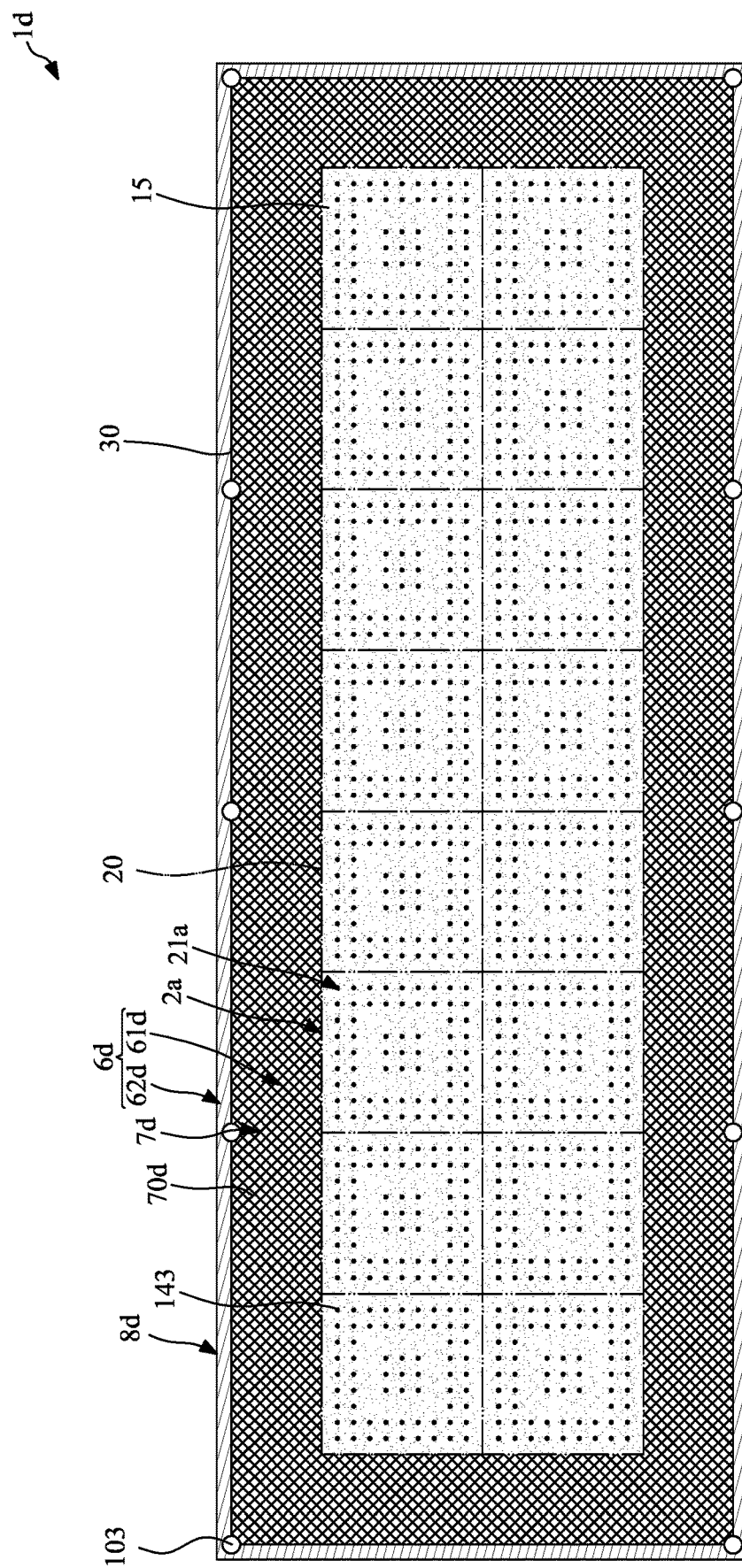
FIG. 12 illustrates a bottom view of the substrate structure of FIG. 11.

FIG. 11 illustrates an enlarged cross-sectional view of a substrate structure 1d in accordance with some embodiments of the present disclosure. FIG. 12 illustrates a bottom view of the substrate structure 1d of FIG. 11. The substrate structure 1d is similar to the substrate structure 1c in FIG. 10 except for structures of the lower side rail 6d, the third structure 7d (e.g., the lower stress relief structure) and the fourth structure 8d (e.g., the lower reinforcing structure). The lower side rail 6d includes a third region 61d surrounding the bottom layout area 2a, and a fourth region 62d surrounding the third region 61d. A width of the third region 61d is greater than a width of the first region 31, and a width of the fourth region 62d is less than a width of the second region 32. That is, the second boundary 30' on the lower surface 102 of the main body 10 is not aligned with the second boundary 30 on the upper surface 101 of the main body 10.

As shown in FIG. 12, the third structure 7d (e.g., the lower stress relief structure) is disposed on the entire third region 61d, and includes the strips 70 cross with each other. In addition, the pattern of the fourth structure 8d (e.g., the lower reinforcing structure) is in a continuous ring shape from a bottom view. That is, the fourth region 62d of the lower side rail 6d is full of a metal material. Thus, a size (e.g., a width) of the fourth structure 8d (e.g., the lower reinforcing structure) is less than a size (e.g., a width) of the second structure 5c (e.g., the upper reinforcing structure).

Figure 13:
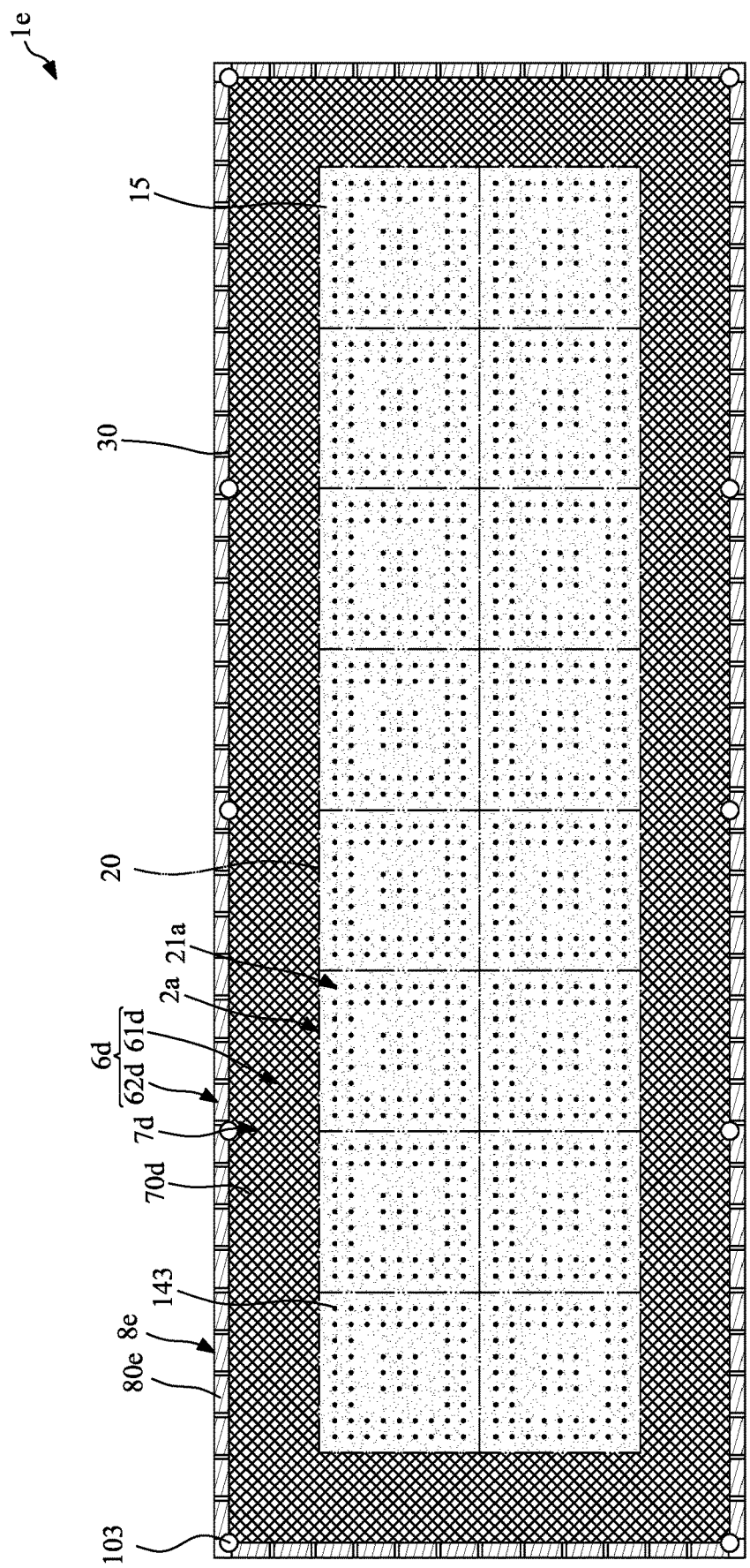
FIG. 13 illustrates a bottom view of a substrate structure in accordance with some embodiments of the present disclosure.

FIG. 13 illustrates a bottom view of a substrate structure 1e in accordance with some embodiments of the present disclosure. The substrate structure 1e is similar to the substrate structure 1d in FIG. 11 and FIG. 12 except for a structure of the fourth structure 8e (e.g., the lower reinforcing structure). As shown in FIG. 13, the fourth structure 8e (e.g., the lower reinforcing structure) is in a discontinuous ring shape from a bottom view. Thus, the fourth structure 8e (e.g., the lower reinforcing structure) includes a row of segments 80e.

Figure 14:
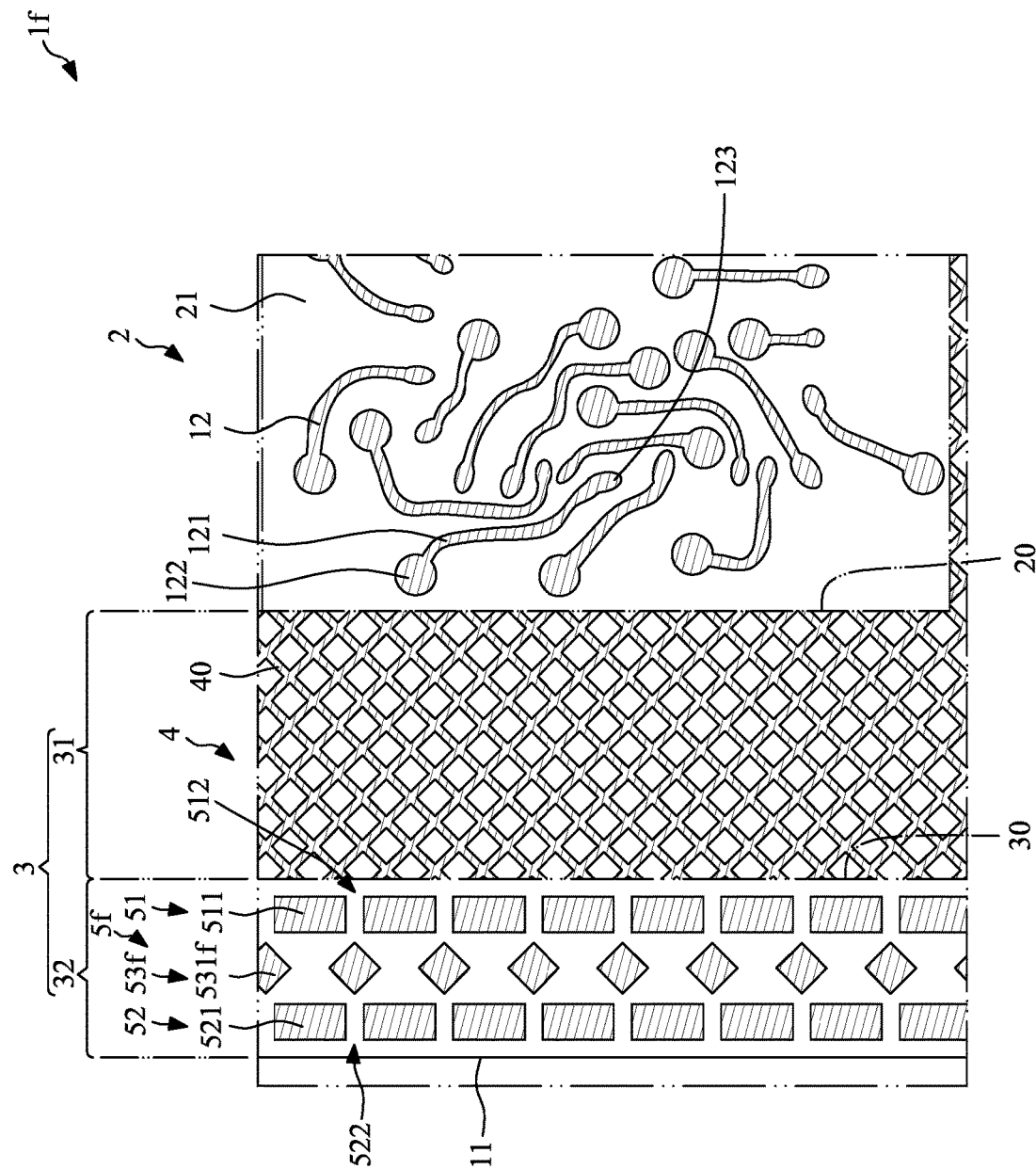
FIG. 14 illustrates a partially enlarged view of a substrate structure in accordance with some embodiments of the present disclosure.

FIG. 14 illustrates a partially enlarged view of a substrate structure 1f in accordance with some embodiments of the present disclosure. The substrate structure 1f is similar to the substrate structure 1 in FIG. 1 to FIG. 6 except for a shape of the third segment 531f in the intermediate row 53f of the second structure 5f (e.g., the upper reinforcing structure). As shown in FIG. 14, the third segment 531f is in a diamond shape.

Figure 15:
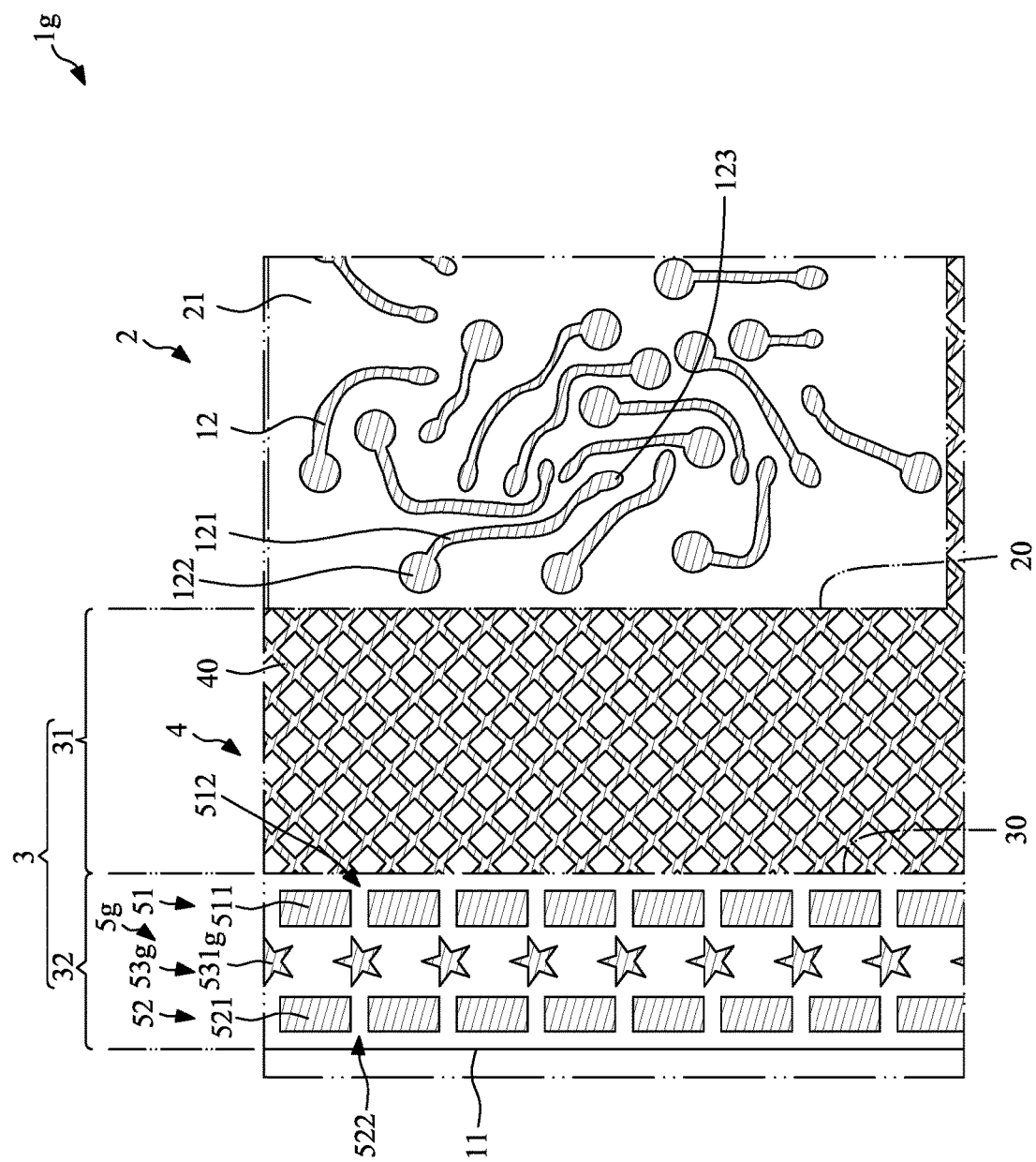
FIG. 15 illustrates a partially enlarged view of a substrate structure in accordance with some embodiments of the present disclosure.

FIG. 15 illustrates a partially enlarged view of a substrate structure 1g in accordance with some embodiments of the present disclosure. The substrate structure 1g is similar to the substrate structure 1 in FIG. 1 to FIG. 6 except for a shape of the third segment 531g in the intermediate row 53g of the second structure 5g (e.g., the upper reinforcing structure). As shown in FIG. 15, the third segment 531g is in a star shape.

Figure 16:
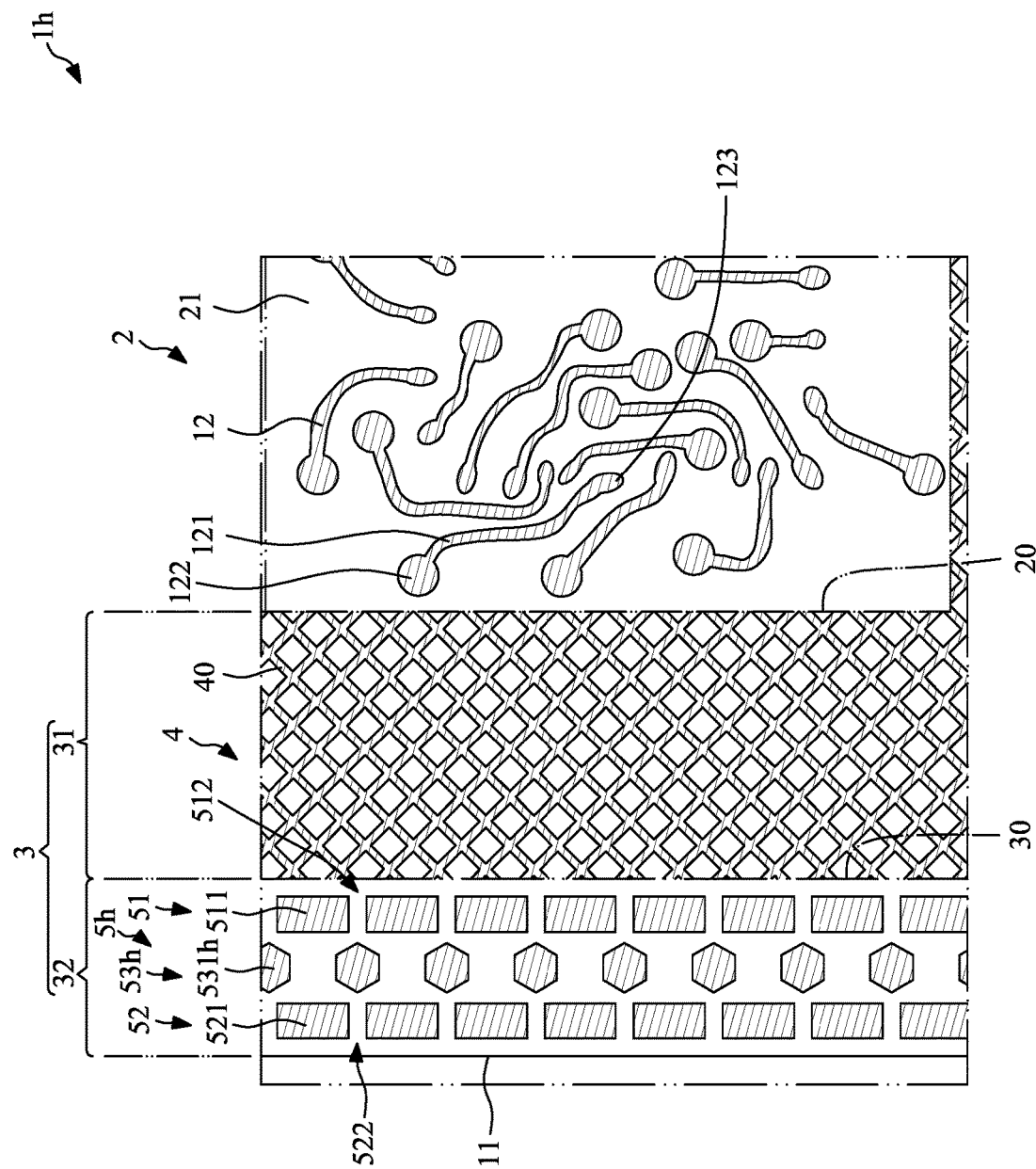
FIG. 16 illustrates a partially enlarged view of a substrate structure in accordance with some embodiments of the present disclosure.

FIG. 16 illustrates a partially enlarged view of a substrate structure 1h in accordance with some embodiments of the present disclosure. The substrate structure 1h is similar to the substrate structure 1 in FIG. 1 to FIG. 6 except for a shape of the third segment 531h in the intermediate row 53h of the second structure 5h (e.g., the upper reinforcing structure). As shown in FIG. 16, the third segment 531h is in a hexagon shape.

Figure 17:
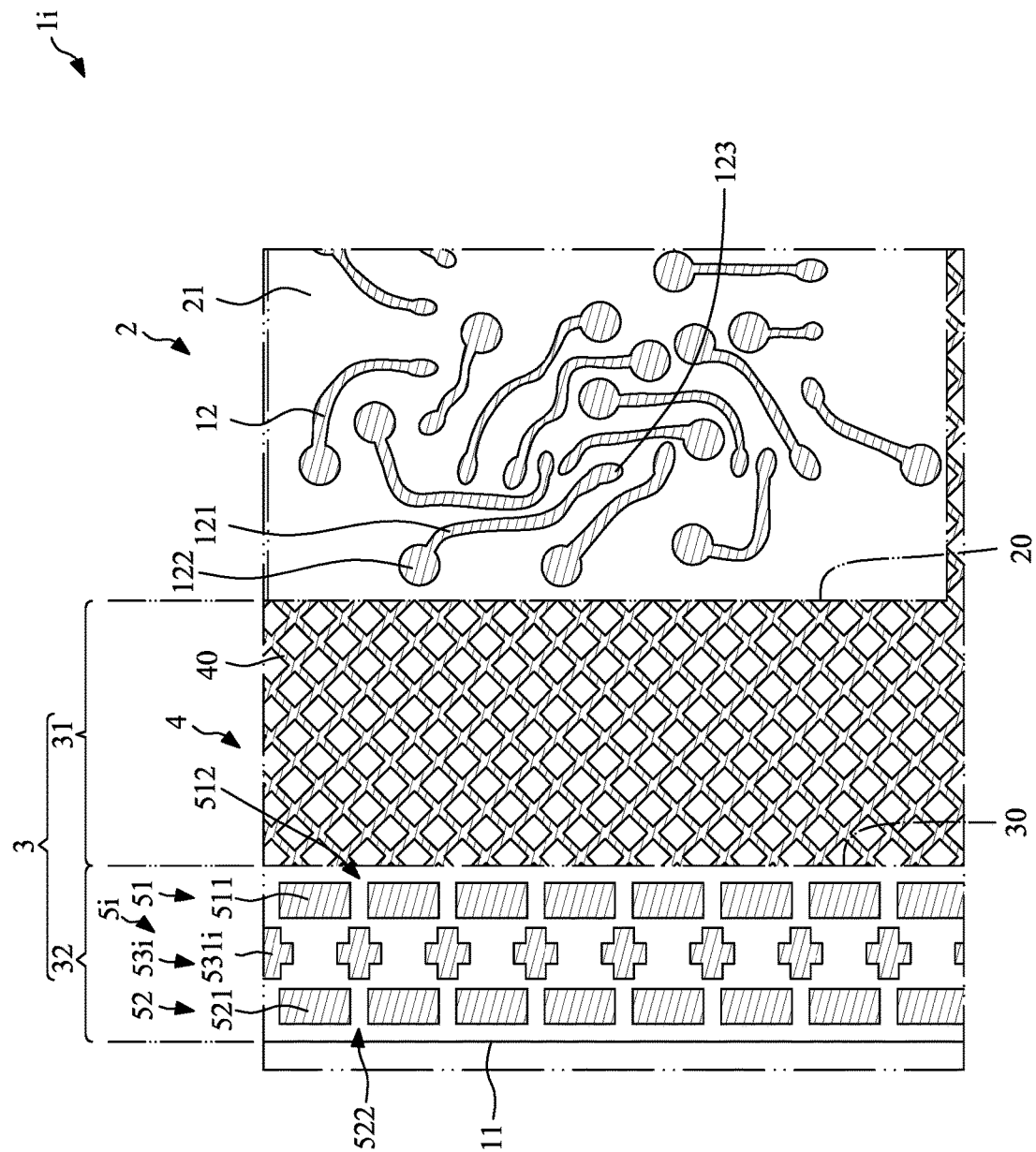
FIG. 17 illustrates a partially enlarged view of a substrate structure in accordance with some embodiments of the present disclosure.

FIG. 17 illustrates a partially enlarged view of a substrate structure 1i in accordance with some embodiments of the present disclosure. The substrate structure 1i is similar to the substrate structure 1 in FIG. 1 to FIG. 6 except for a shape of the third segment 531i in the intermediate row 53i of the second structure 5i (e.g., the upper reinforcing structure). As shown in FIG. 17, the third segment 531i is in a cross shape.

Figure 18:
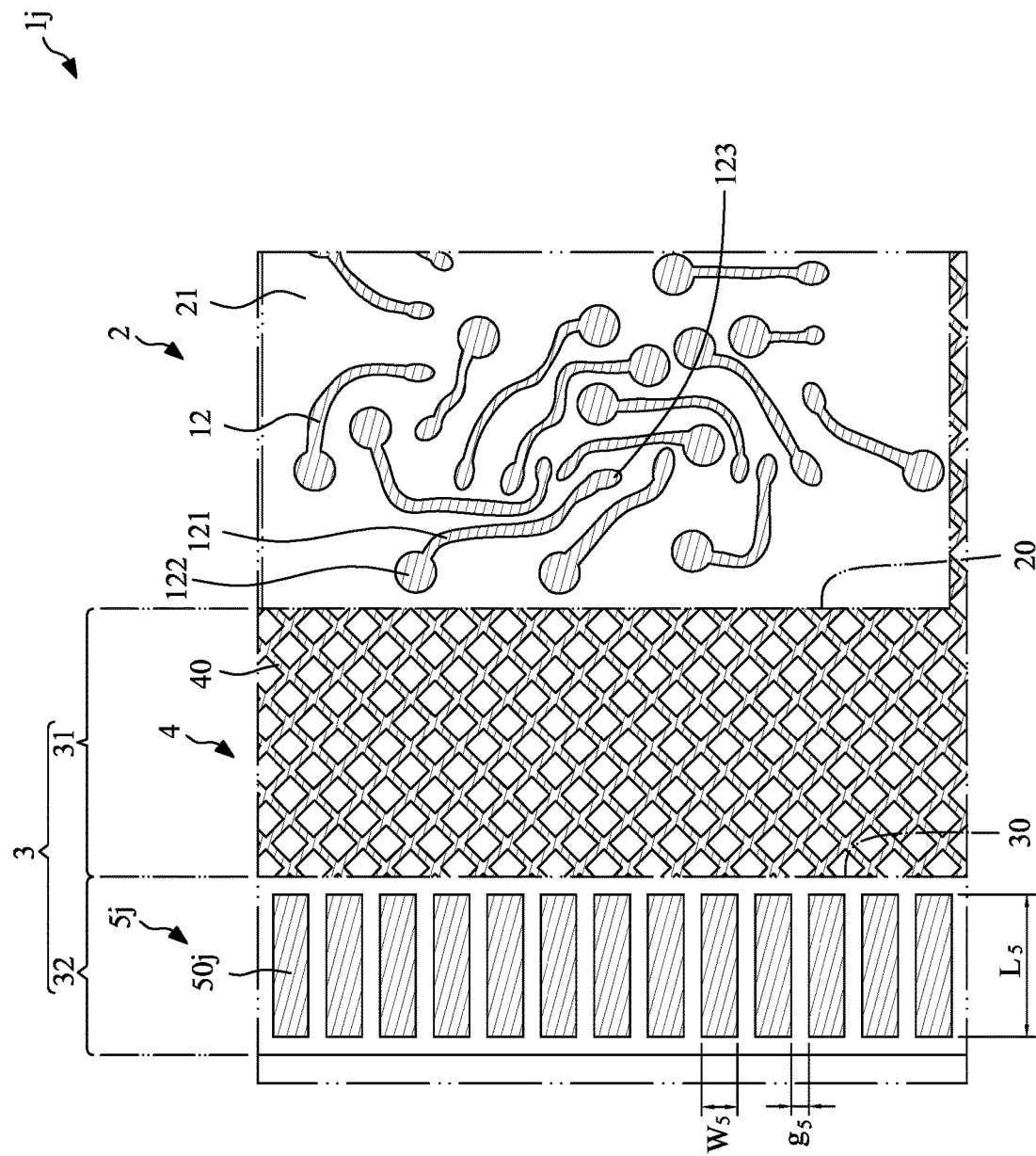
FIG. 18 illustrates a partially enlarged view of a substrate structure in accordance with some embodiments of the present disclosure.

FIG. 18 illustrates a partially enlarged view of a substrate structure 1j in accordance with some embodiments of the present disclosure. The substrate structure 1j is similar to the substrate structure 1 in FIG. 1 to FIG. 6 except for a structure of the second structure 5j (e.g., the upper reinforcing structure). As shown in FIG. 18, the second structure 5j (e.g., the upper reinforcing structure) includes one row of segments 50j. The segments 50j are parallel with one another, so as to form a zebra stripe pattern. In one embodiment, a length $L_5$ of the segment 50j is about 2 mm to about 6 mm, a width $W_5$ of the segment 50j is about 1 mm to about 2 mm, and a gap $g_5$ between two adjacent segments 50j is about 0.1 mm to about 0.7 mm.

Figure 19:
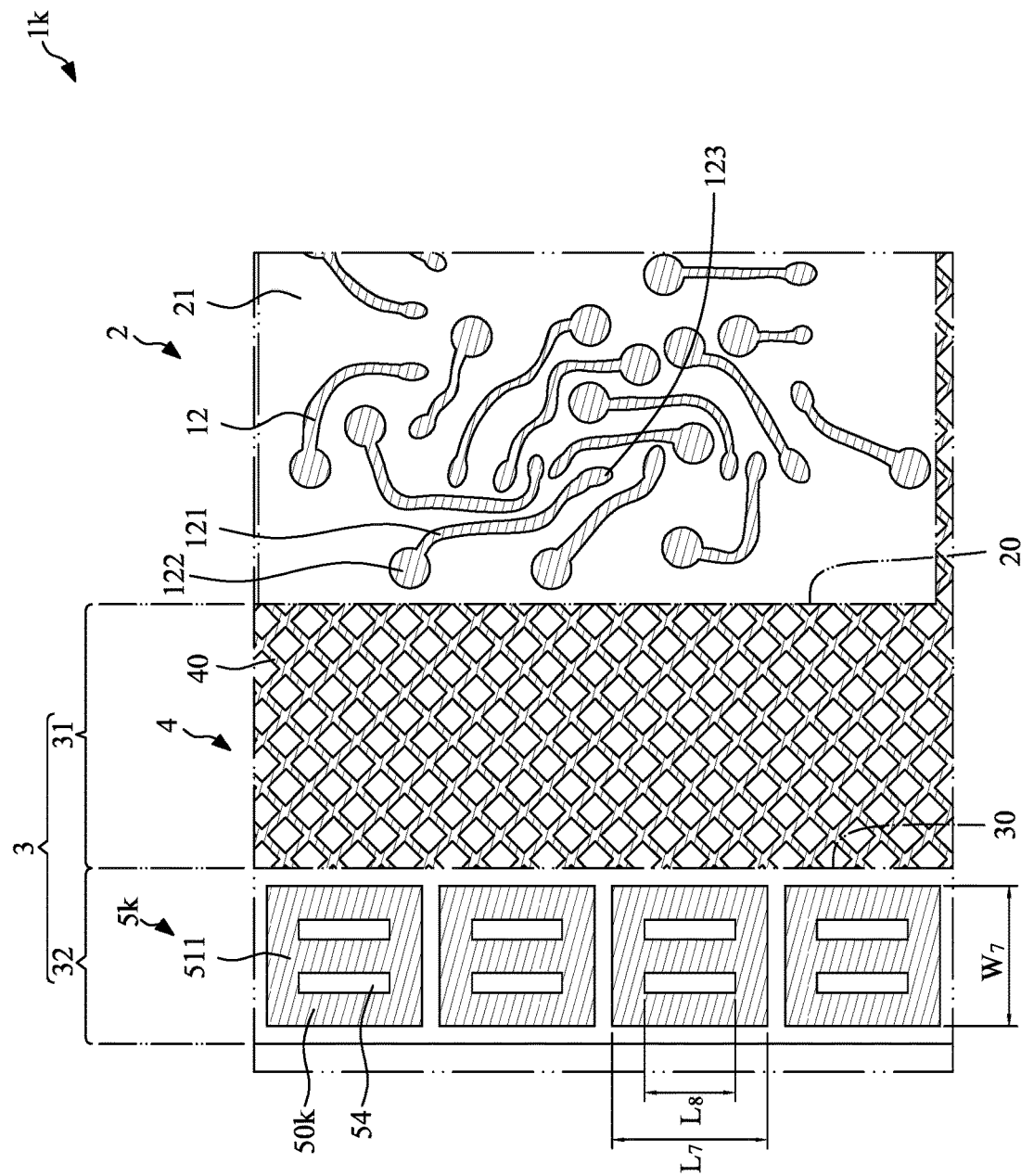
FIG. 19 illustrates a partially enlarged view of a substrate structure in accordance with some embodiments of the present disclosure.

FIG. 19 illustrates a partially enlarged view of a substrate structure 1k in accordance with some embodiments of the present disclosure. The substrate structure 1k is similar to the substrate structure 1 in FIG. 1 to FIG. 6 except for a structure of the second structure 5k (e.g., the upper reinforcing structure). As shown in FIG. 19, the second structure 5k (e.g., the upper reinforcing structure) includes one row of segments 50k. Each of the segments 50k defines two openings 54. In one embodiment, a length $L_7$ of the segment 50k is about 4 mm to about 8 mm, a width $W_7$ of the segment 50k is about 2 mm to about 6 mm, and a length Ls of the opening 54 is about 2 mm to about 6 mm.

Figure 20:
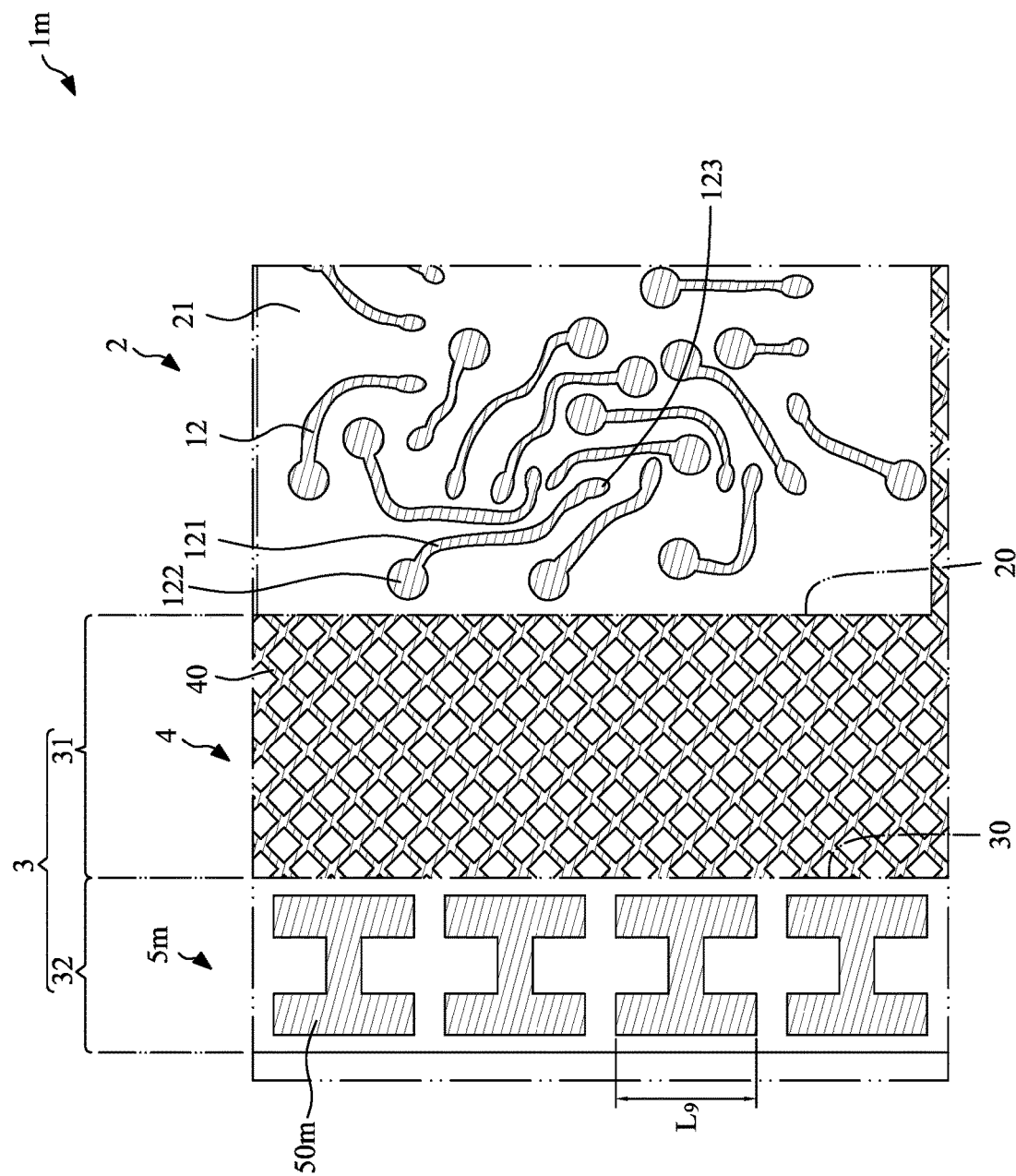
FIG. 20 illustrates a partially enlarged view of a substrate structure in accordance with some embodiments of the present disclosure.

FIG. 20 illustrates a partially enlarged view of a substrate structure 1m in accordance with some embodiments of the present disclosure. The substrate structure 1m is similar to the substrate structure 1 in FIG. 1 to FIG. 6 except for a structure of the second structure 5m (e.g., the upper reinforcing structure). As shown in FIG. 20, the second structure 5m (e.g., the upper reinforcing structure) includes one row of segments 50m. Each of the segments 50m is in an "H" shape. In one embodiment, a length $L_9$ of the segment 50m is about 4 mm to about 8 mm.

Figure 21:
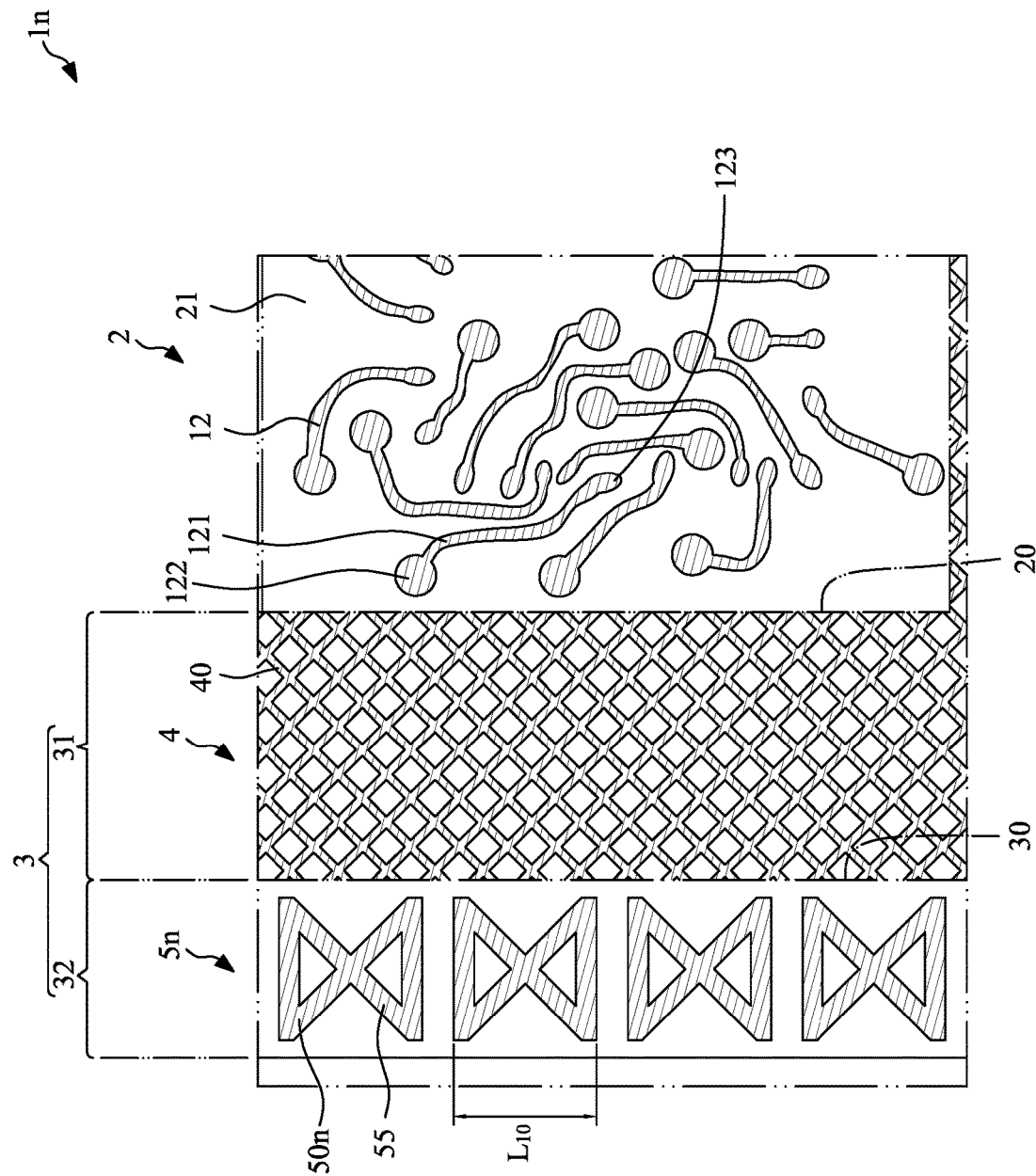
FIG. 21 illustrates a partially enlarged view of a substrate structure in accordance with some embodiments of the present disclosure.

FIG. 21 illustrates a partially enlarged view of a substrate structure 1n in accordance with some embodiments of the present disclosure. The substrate structure 1n is similar to the substrate structure 1 in FIG. 1 to FIG. 6 except for a structure of the second structure 5n (e.g., the upper reinforcing structure). As shown in FIG. 21, the second structure 5n (e.g., the upper reinforcing structure) includes one row of segments 50n. Each of the segments 50n is a combination of four bars 55. Two bars 55 cross with each other to form a "X" shape, and the other two bars 55 are disposed on a top portion and a bottom portion of the "X" shape respectively. In one embodiment, a length $L_{10}$ of the segment 50n is about 4 mm to about 8 mm, and a width of each of the bars 55 is about 1 mm to about 2 mm.

Figure 22:
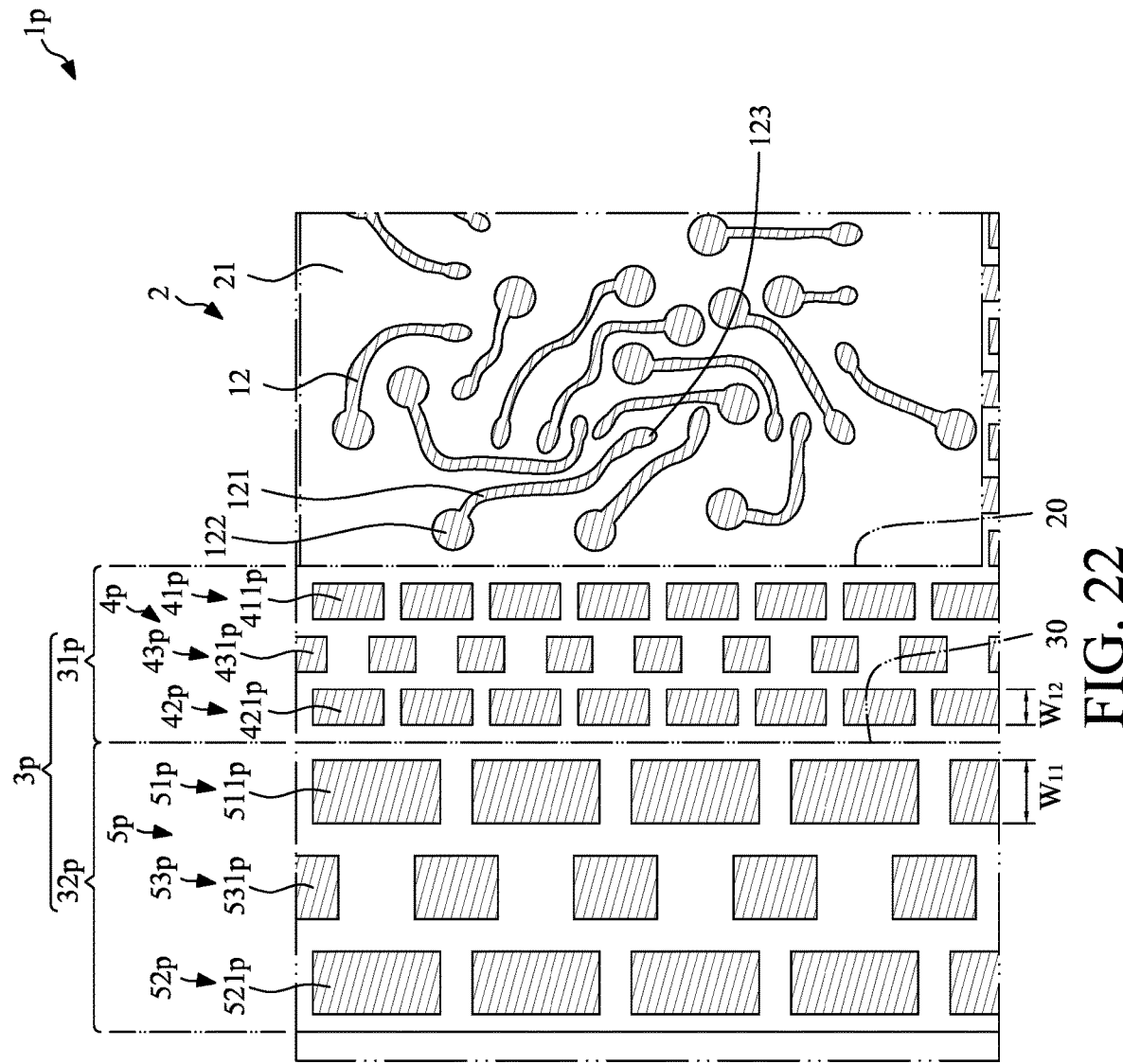
FIG. 22 illustrates a partially enlarged view of a substrate structure in accordance with some embodiments of the present disclosure.

FIG. 22 illustrates a partially enlarged view of a substrate structure 1p in accordance with some embodiments of the present disclosure. The substrate structure 1p is similar to the substrate structure 1 in FIG. 1 to FIG. 6 except for structures of the upper side rail 3p, the first structure 4p (e.g., the upper stress relief structure) and the second structure 5p (e.g., the upper reinforcing structure). The upper side rail 3p includes a first region 31p and a second region 32p surrounding the first region 31p. A width of the second region 32p is greater than a width of the first region 31p. The first structure 4p (e.g., the upper stress relief structure) may include three parallel rows of segments such as an innermost row 41p of first segments 411p, an outermost row 42p of second segments 421p and an intermediate row 43p of third segments 431p. Further, the second structure 5p (e.g., the upper reinforcing structure) may include three parallel rows of segments such as an innermost row 51p of first segments 511p, an outermost row 52p of second segments 521p and an intermediate row 53p of third segments 531p. Thus, a pattern of the first structure 4p (e.g., the upper stress relief structure) is substantially same as a pattern of the second structure 5p (e.g., the upper reinforcing structure). A width $W_{11}$ of the first segments 511p of the second structure 5p is greater than a width $W_{12}$ of the second segments 421p of the first structure 4p. For example, the width $W_{11}$ of the first segments 511p of the second structure 5p may be greater than 1.3 times, 1.5 times, or 2 times the width $W_{12}$ of the second segments 421p of the first structure 4p.

Figure 23:
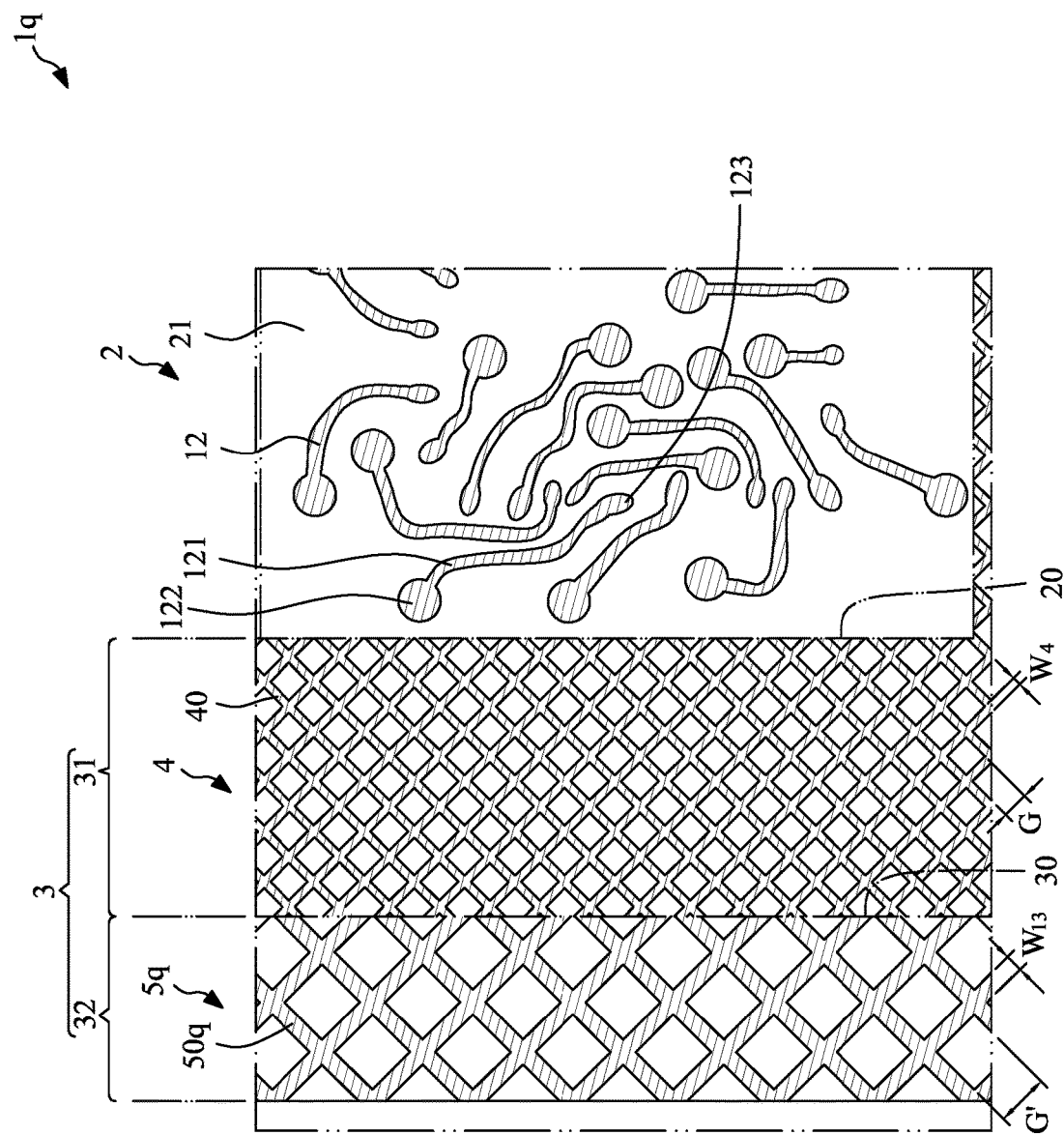
FIG. 23 illustrates a partially enlarged view of a substrate structure in accordance with some embodiments of the present disclosure.

FIG. 23 illustrates a partially enlarged view of a substrate structure 1q in accordance with some embodiments of the present disclosure. The substrate structure 1q is similar to the substrate structure 1 in FIG. 1 to FIG. 6 except for a structures of the second structure 5q (e.g., the upper reinforcing structure). As shown in FIG. 23, the second structure 5q (e.g., the upper reinforcing structure) includes a plurality of strips 50q cross with each other to form a net shape. Thus, a pattern of the first structure 4 (e.g., the upper stress relief structure) is substantially same as a pattern of the second structure 5q (e.g., the upper reinforcing structure). A width $W_{13}$ of each of the strips 50q may be greater than the width $W_4$ of each of the strips 40, and a gap G' between two adjacent strips 50q may be greater than the gap G between two adjacent strips 40.

Figure 24:
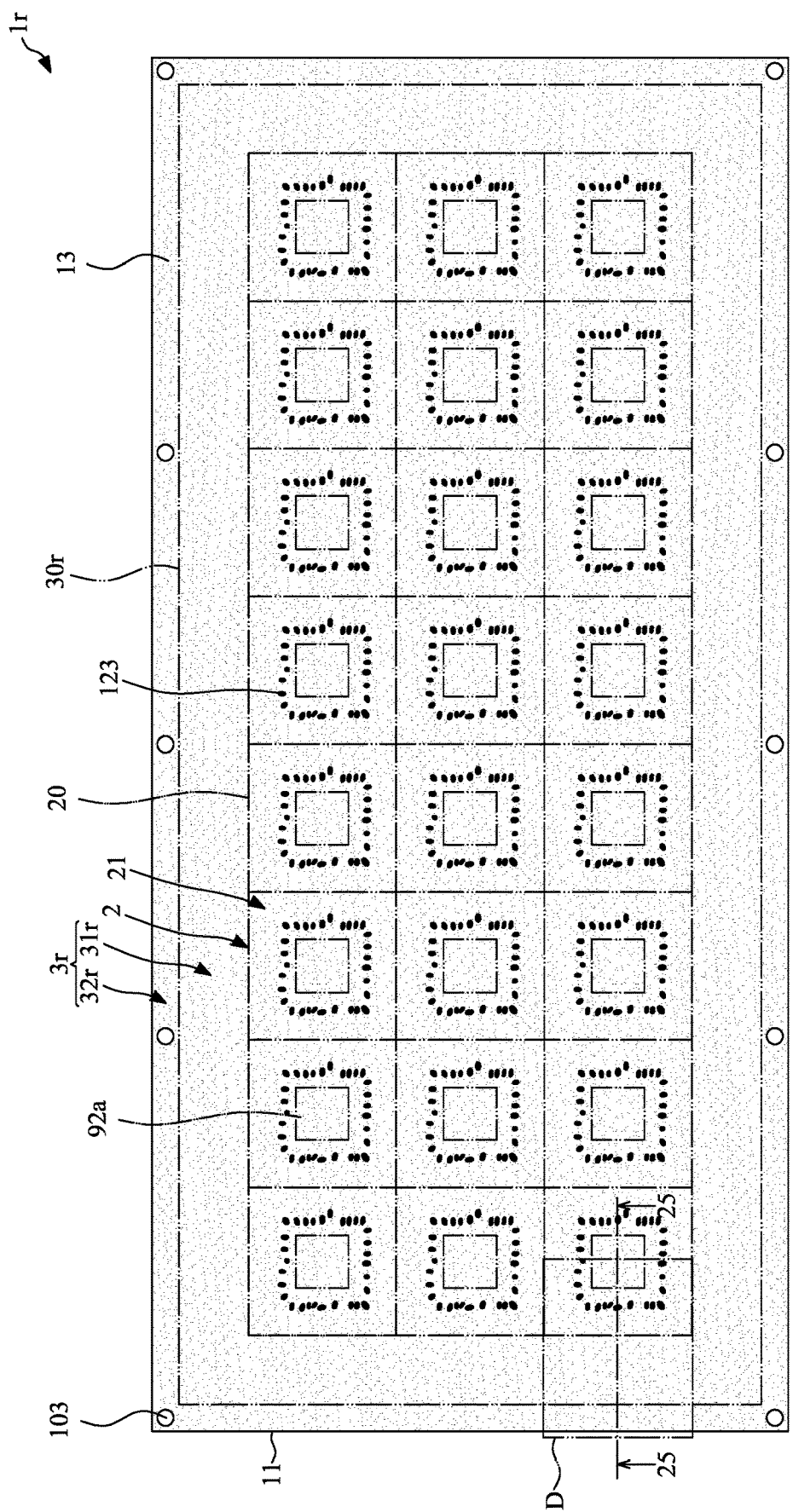
FIG. 24 illustrates a top view of a substrate structure in accordance with some embodiments of the present disclosure.
Figure 25:
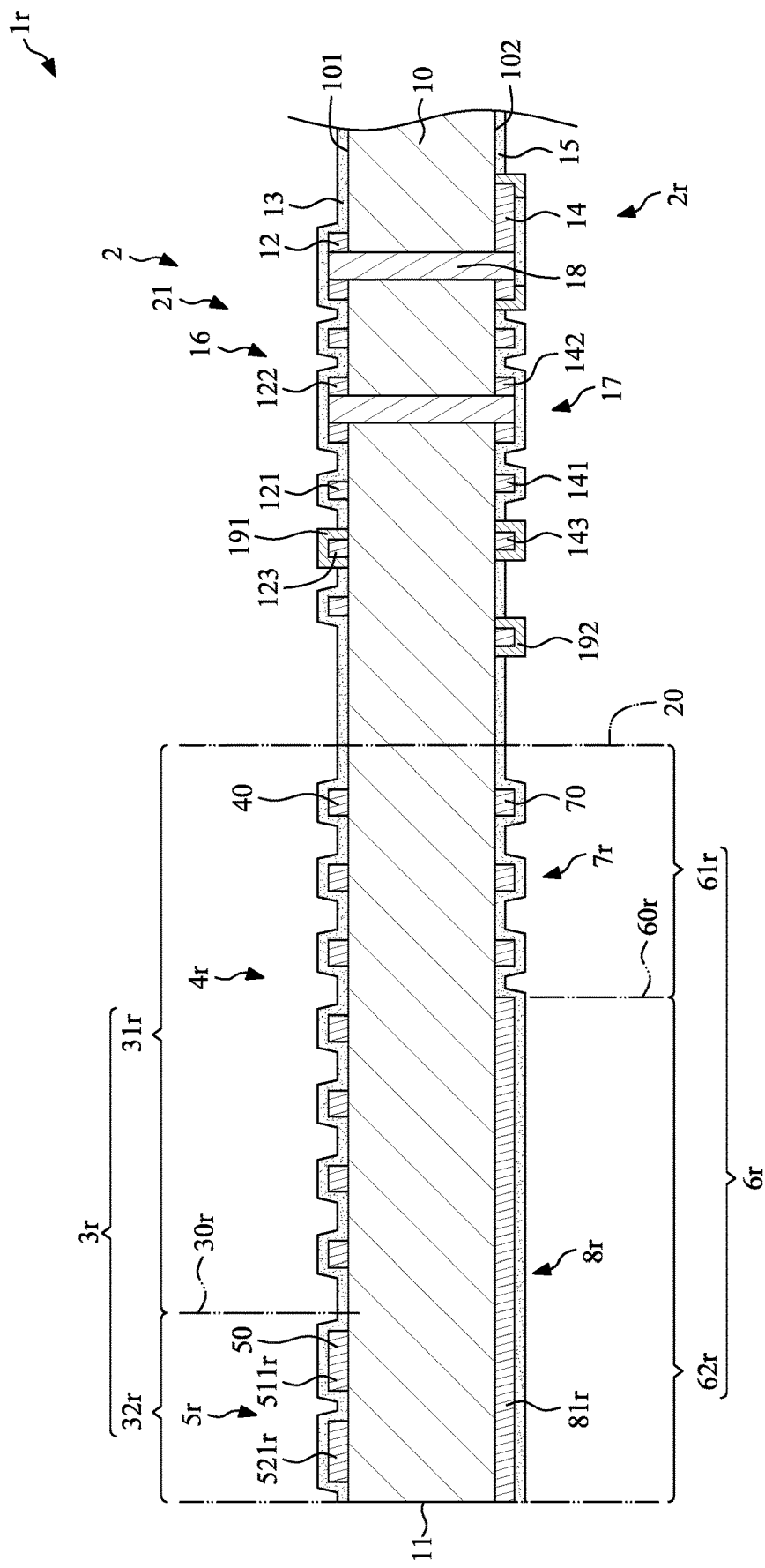
FIG. 25 illustrates an enlarged cross-sectional view taken along line 25-25 in a region "D" in FIG. 24.

FIG. 24 illustrates a top view of a substrate structure 1r in accordance with some embodiments of the present disclosure. FIG. 25 illustrates an enlarged cross-sectional view taken along line 25-25 in a region "D" in FIG. 24. The substrate structure 1r is similar to the substrate structure 1 in FIG. 1 to FIG. 6 except for structures of the upper side rail 3r and the lower side rail 6r. That is, the substrate structure 1r includes the main body 10, the chip attach area 2, the upper side rail 3r, the upper metal layer 16, a bottom area 2r (i.e., the bottom layout area 2a), the lower side rail 6r, the lower metal layer 17, the upper solder resist layer 13, the lower solder resist layer 15, the conductive vias 18 and the position holes 103.

The upper surface 101 of the main body 10 includes the chip attach area 2 and the upper side rail 3r surrounding the chip attach area 2. The upper side rail 3r may include a first upper region 31r surrounding the chip attach area 2, and a second upper region 32r surrounding the first region 31r. There may be a second boundary line 30r between the second upper region 32r and the first upper region 31r.

The upper metal layer 16 is disposed adjacent to the upper surface 101 of the main body 10, and is a patterned metal layer that includes the upper circuit layer 12 disposed in the chip attach area 2, a first upper structure 4r (e.g., an upper stress relief structure) disposed in the first upper region 31r, and a second upper structure 5r (e.g., an upper reinforcing structure) disposed in the second upper region 32r. In some embodiments, the upper circuit layer 12, the first upper structure 4r (e.g., the upper stress relief structure) and the second upper structure 5r (e.g., the upper reinforcing structure) are disposed at the same layer, and are formed currently at a process stage. A material of the upper metal layer 16 (including the upper circuit layer 12, the first upper structure 4r (e.g., an upper stress relief structure) and the second upper structure 5r (e.g., an upper reinforcing structure)) may include a metal material such as copper, gold, aluminum, or other suitable metal.

The lower surface 102 of the main body 10 includes the bottom area 2r and the lower side rail 6r surrounding the bottom area 2r. The lower side rail 6r may include a first lower region 61r surrounding the bottom area 2r, and a second lower region 62r surrounding the first lower region 61r. There may be a third boundary line 60r between the first lower region 61r and the second lower region 62r. The third boundary line 60r may be not aligned with the second boundary line 30r. The lower metal layer 17 is disposed adjacent to the lower surface 102 of the main body 10, and is a patterned metal layer that includes a lower circuit layer 14 disposed in the bottom area 2r, a first lower structure 7r (e.g., a lower stress relief structure) disposed in the first lower region 61r, and a second lower structure 8r (e.g., a lower reinforcing structure) disposed in the second lower region 62r. In some embodiments, the lower circuit layer 14, the first lower structure 7r (e.g., a lower stress relief structure) and the second lower structure 8r (e.g., a lower reinforcing structure) are disposed at the same layer, and are formed currently at a process stage. A material of the lower metal layer 17 (including the lower circuit layer 14, the first lower structure 7r (e.g., a lower stress relief structure) and the second lower structure 8r (e.g., a lower reinforcing structure)) may include a metal material such as copper, gold, aluminum, or other suitable metal.

Figure 32:
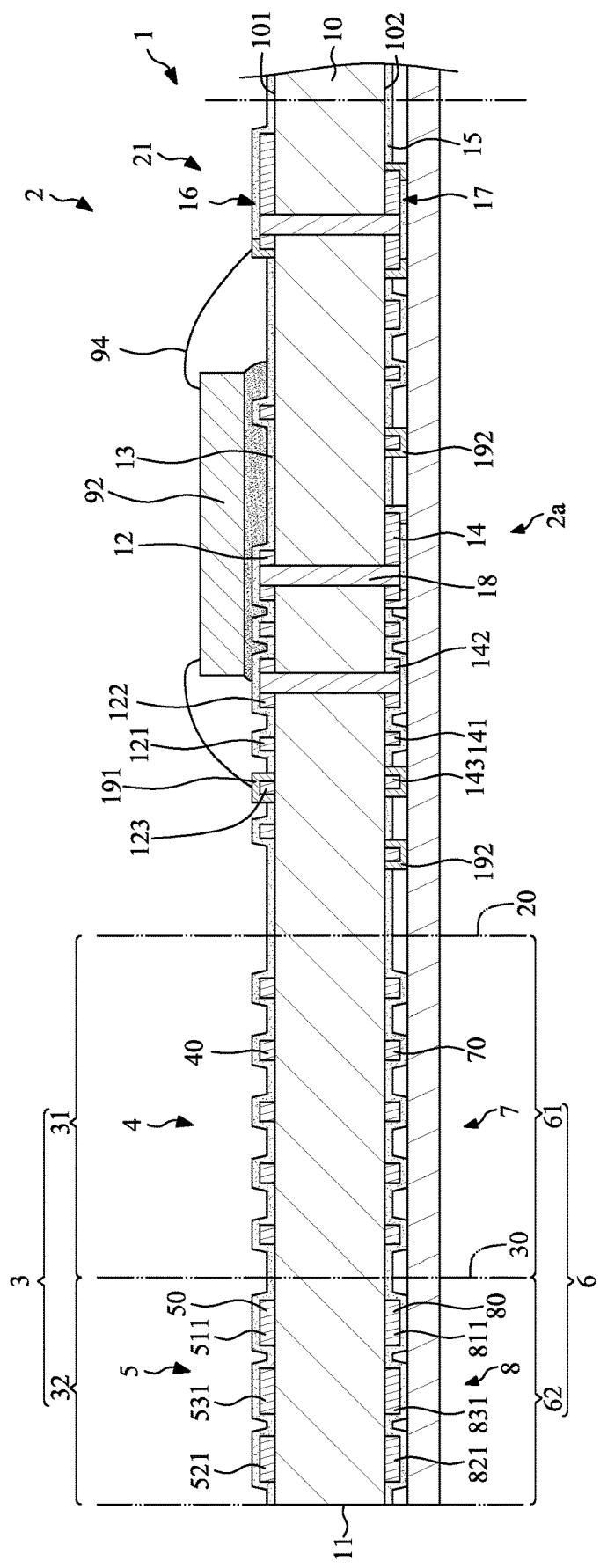
FIG. 32 illustrates one or more stages of an example of a method for manufacturing a semiconductor package according to some embodiments of the present disclosure.

The chip attach area 2 is used for at least one semiconductor chip 92 (FIG. 32) to be disposed thereon. As shown in FIG. 24, the chip attach area 2 includes a plurality of unit areas 21. For example, 3*8=24 unit areas 21. Each of the unit areas 21 is defined by a plurality of first boundary lines 20 cross with each other, and is a place wherein at least one semiconductor chip 92 (FIG. 32) is disposed on. In one embodiment, the chip attach area 2 includes a plurality of chip regions 92a. Each of the unit areas 21 includes a chip region 92a. The chip region 92a is a region where the semiconductor chip 92 (FIG. 32) projects on the substrate structure 1r. Thus, a size of the chip region 92a is equal to a size of the semiconductor chip 92 (FIG. 32). In one embodiment, a ratio of a sum of the areas of the chip regions 92a from a top view to an area of the entire substrate structure 1r from a top view is greater than 40%, 50%, 60% or 70%. Thus, the distribution of the semiconductor chips 92 (FIG. 32) are relatively dense, and after the molding process, the substrate structure 1r may have a convex warpage (or crying face warpage) readily.

The upper solder resist layer 13 is disposed on the upper surface 101 of the main body 10 to cover at least a portion of the upper metal layer 16. The lower solder resist layer 15 is disposed on the lower surface 102 of the main body 10 to cover at least a portion of the lower metal layer 17. The position holes 103 extend through the substrate structure 1r and are used for position pins to be inserted therein. Thus, the position of the substrate structure 1r is ensured during the subsequent manufacturing process.

Figure 26:
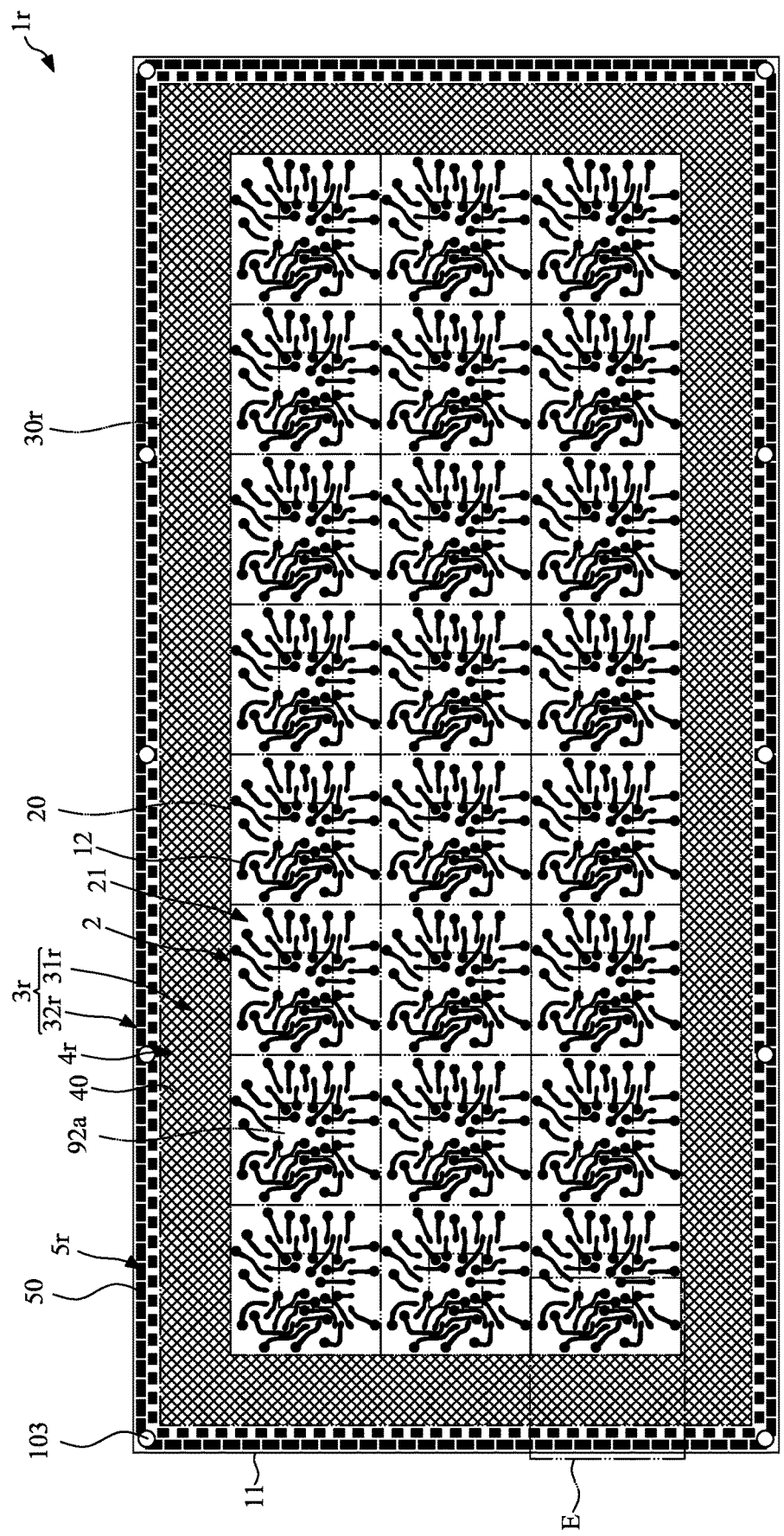
FIG. 26 illustrates a top view of the substrate structure of FIG. 24.

FIG. 26 illustrates a top view of the substrate structure 1r of FIG. 24, wherein the upper solder resist layer 13 and the lower solder resist layer 15 are omitted for clarity of illustration. As shown in FIG. 26, the upper circuit layer 12 may be disposed in each of the unit areas 21, the first upper structure 4r (e.g., the upper stress relief structure) may be disposed in the first upper region 31r, and the second structure 5r (e.g., the upper reinforcing structure) may be disposed in the second region 32r. Thus, the first upper structure 4r (e.g., the upper stress relief structure) surrounds the chip attach area 2, and the second upper structure 5r (e.g., the upper reinforcing structure) surrounds the first upper structure 4r (e.g., the upper stress relief structure). The first upper structure 4r (e.g., the upper stress relief structure) is disposed between the chip attach area 2 and the second upper structure 5r (e.g., the upper reinforcing structure).

Figure 27:
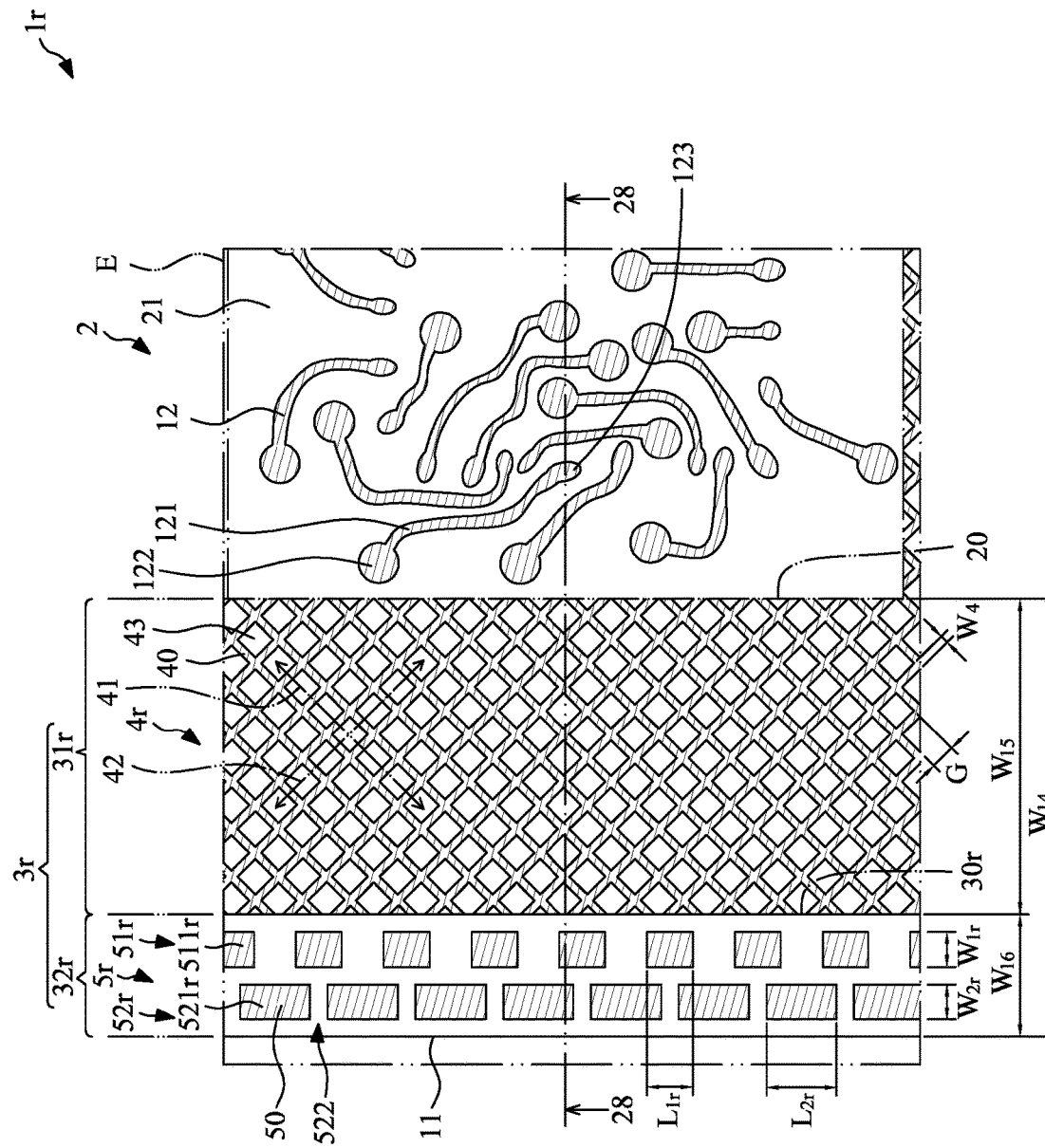
FIG. 27 illustrates an enlarged view of a region "E" in FIG. 26.
Figure 28:
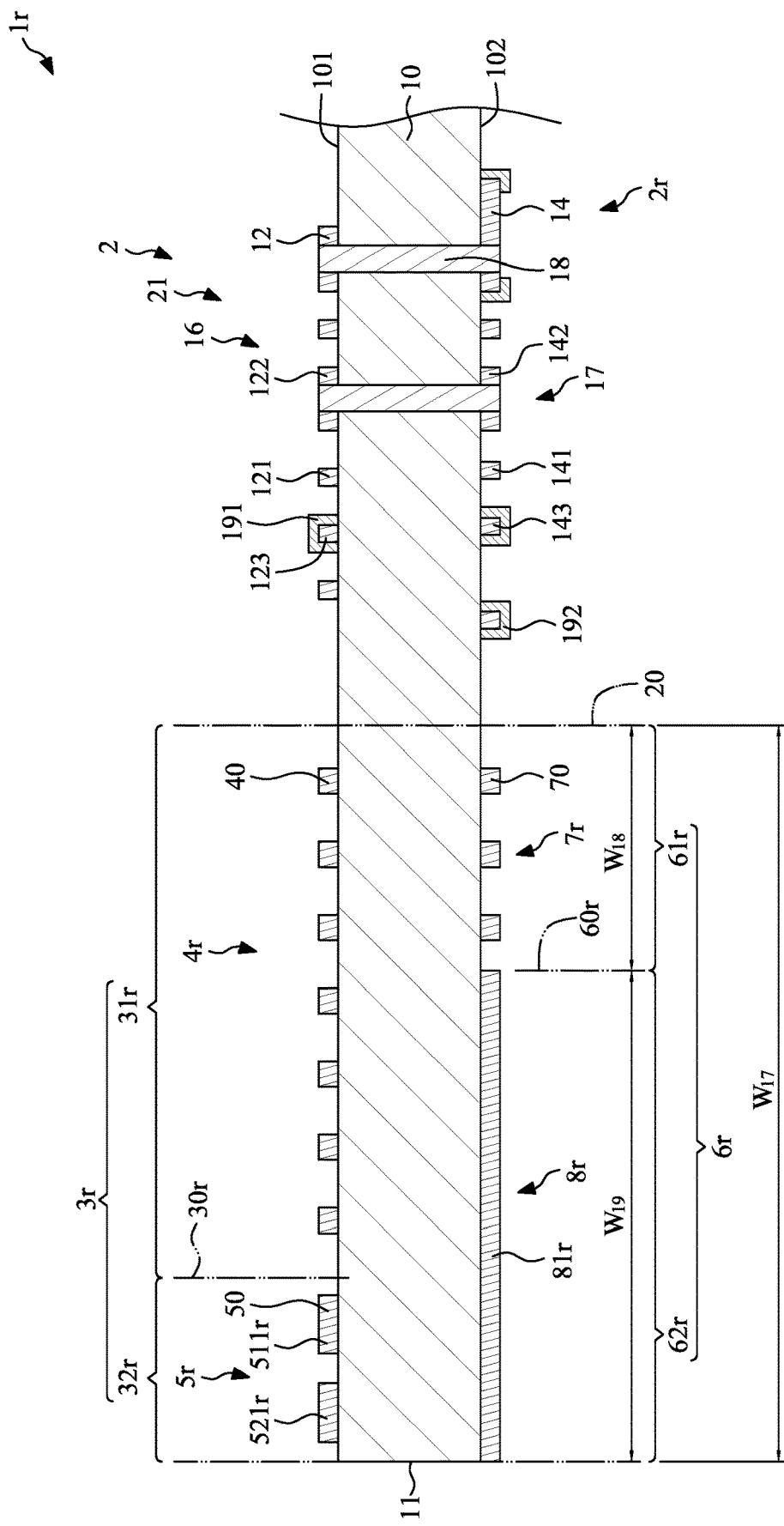
FIG. 28 illustrates an enlarged cross-sectional view taken along line 28-28 in FIG. 27.

FIG. 27 illustrates an enlarged view of a region "E" in FIG. 26. FIG. 28 illustrates an enlarged cross-sectional view taken along line 28-28 in FIG. 27. The upper circuit layer 12 and the lower circuit layer 14 may be similar to the upper circuit layer 12 and the lower circuit layer 14 of FIG. 5, respectively. The first upper structure 4r (e.g., the upper stress relief structure) may be physically connected to the second upper structure 5r (e.g., the upper reinforcing structure). Alternatively, the first upper structure 4r (e.g., the upper stress relief structure) may be physically separated from the second upper structure 5r (e.g., the upper reinforcing structure). For example, the first upper structure 4r (e.g., the upper stress relief structure) may be used for releasing the stress of the substrate structure 1r so as to reduce the residual stress in the substrate structure 1r. That is, a stress relieving ability of the first upper structure 4r (e.g., the upper stress relief structure) is greater than a stress relieving ability of the second upper structure 5r (e.g., the upper reinforcing structure). Further, the second upper structure 5r (e.g., the upper reinforcing structure) may be used for providing rigidity and stiffness so as to resist a deformation of the substrate structure 1r. That is, a structural strength of the second upper structure 5r (e.g., the upper reinforcing structure) is greater than a structural strength of the first upper structure 4r (e.g., the upper stress relief structure).

As shown in FIG. 27, the pattern of the first upper structure 4r (e.g., the upper stress relief structure) is in a net shape from a top view. In one embodiment, the first upper structure 4r (e.g., the upper stress relief structure) includes a plurality of strips 40 cross with each other to form the net shape. A width $W_4$ of each of the strips 40 may be about 0.1 millimeter (mm) to about 0.7 mm. A gap G between two adjacent strips 40 may be about 0.4 mm to about 2.0 mm. The pattern of the first upper structure 4r (e.g., the upper stress relief structure) may be similar to the pattern of the first structure 4 (e.g., the upper stress relief structure) of FIG. 4.

The second structure 5 (e.g., the upper reinforcing structure) may include at least one row of segments 50 substantially parallel with the edge 11 of the substrate structure 1r. As shown in FIG. 27, the second structure 5r (e.g., the upper reinforcing structure) may include two parallel rows of the segments 50 such as an innermost row 51r of first segments 511r and an outermost row 52r of second segments 521r. The shape of each of the segments 50 (e.g., the first segments 511r and the second segments 521r) may be rectangular or square. A size of each of the first segments 511r is different from the size of each of the second segments 521r. For example, a width $W_{1r}$ of the first segment 511r may be equal to a width $W_{2r}$ of the second segments 521r, which may be about 1 mm to about 2 mm. Further, a length $L_{1r}$ of the first segment 511r may be about 2 mm to 4 mm. A length $L_{2r}$ of the second segments 521r may be about 4 mm to about 6 mm, which may be greater than the length $L_{1r}$ of the first segment 511r.

In addition, the first segments 511r are misaligned with the second segments 521r. For example, two adjacent second segments 521r define a second gap 522, and a center of the first segment 511r corresponds to the second gap 522. In one embodiment, the second gap 522 may be about 0.1 mm to 0.7 mm.

The upper side rail 3r may have a width $W_{14}$. The first upper region 31r may have a width $W_{15}$. The second upper region 32r may have a width $W_{16}$. The width $W_{15}$ of the first upper region 31r may be greater than the width $W_{16}$ of the second upper region 32r. For example, the width $W_{15}$ of the first upper region 31r may be ¾ of the width $W_{14}$ of the upper side rail 3r, and the width $W_{16}$ of the second upper region 32r may be ¼ of the width $W_{14}$ of the upper side rail 3r.

As shown in FIG. 26 and FIG. 27, a first upper occupancy ratio is defined as a ratio of an area of a solid portion of the first upper structure 4r (e.g., the upper stress relief structure) from a top view to an area of the entire first upper region 31r from a top view. A second upper occupancy ratio is defined as a ratio of an area of a solid portion of the second upper structure 5r (e.g., the upper reinforcing structure) from a top view to an area of the entire second upper region 32r from a top view. The second upper occupancy ratio may be greater than the first upper occupancy ratio. In one embodiment, the first upper structure 4r (e.g., the upper stress relief structure) includes copper; thus, the first upper occupancy ratio is a first upper residual copper ratio. Similarly, the second structure 5r (e.g., the upper reinforcing structure) includes copper; thus, the second upper occupancy ratio is a second upper residual copper ratio. Therefore, the second upper residual copper ratio of the second structure 5r (e.g., the upper reinforcing structure) is greater than the first upper residual copper ratio of the first structure 4r (e.g., the upper stress relief structure).

Figure 29:
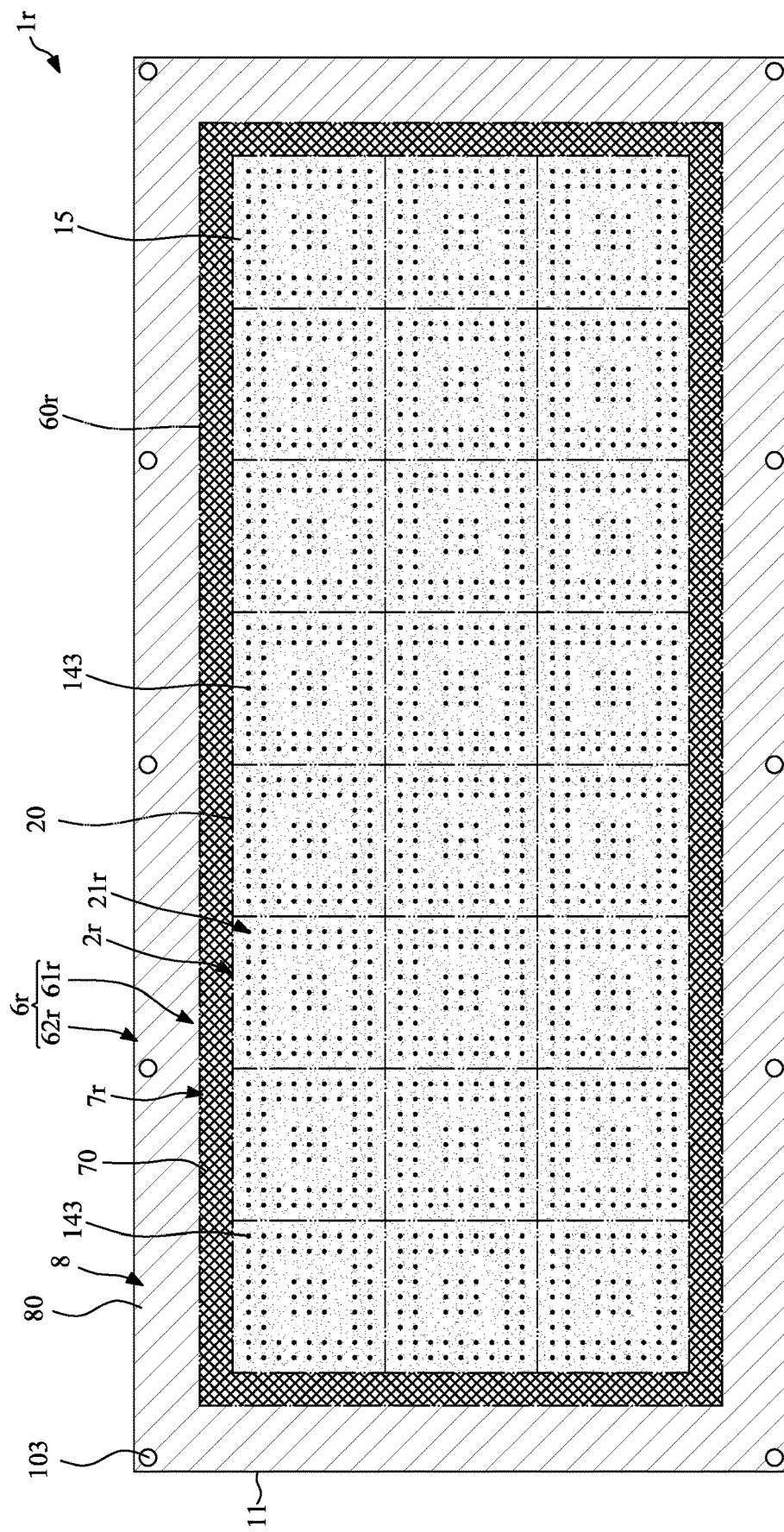
FIG. 29 illustrates a bottom view of the substrate structure of FIG. 24, wherein a portion of the lower solder resist layer that covers the lower side rail is omitted for clarity of illustration.

FIG. 29 illustrates a bottom view of the substrate structure 1r of FIG. 24 and FIG. 25, wherein a portion of the lower solder resist layer 15 that covers the lower side rail 6r is omitted for clarity of illustration. The bottom area 2r corresponds to the chip attach area 2 of FIG. 26. As shown in FIG. 29, the bottom area 2r includes a plurality of unit areas 21r. Each of the unit areas 21r corresponds to each of the unit areas 21, and is also defined by the first boundary lines 20.

The first lower structure 7r (e.g., a lower stress relief structure) may include a plurality of strips 70 cross with each other to form a net shape. The second lower structure 8r (e.g., a lower reinforcing structure) may include at least one row of segments substantially parallel with the edge 11 of the substrate structure 1. Alternatively, the second lower region 62r of the lower side rail 6r may be full of a metal material 81r, thus, the pattern of the second lower structure 8r (e.g., a lower reinforcing structure) is in a continuous ring shape from a bottom view. The shape and size of the second lower structure 8r (e.g., a lower reinforcing structure) are conformal with the shape and size of the second lower region 62r of the lower side rail 6r.

The first lower structure 7r (e.g., a lower stress relief structure) and the second lower structure 8r (e.g., a lower reinforcing structure) may have different functions. For example, the first lower structure 7r (e.g., a lower stress relief structure) may be used for releasing the stress of the substrate structure 1r. That is, a stress relieving ability of the first lower structure 7r (e.g., a lower stress relief structure) is greater than a stress relieving ability of the second lower structure 8r (e.g., a lower reinforcing structure). Further, the second lower structure 8r (e.g., a lower reinforcing structure) may be used for providing rigidity and stiffness. That is, a structural strength of the second lower structure 8r (e.g., a lower reinforcing structure) is greater than a structural strength of the first lower structure 7r (e.g., a lower stress relief structure). Further, the stress relieving ability of the first lower structure 7r is less than the stress relieving ability of the first upper structure 4r. The structural strength of the second lower structure 8r is greater than a structural strength of the second upper structure 5r. In addition, a sum of the structural strength of the second lower structure 8r and the structural strength of the first lower structure 7r is greater than a sum of the structural strength of the second upper structure 5r and the structural strength of the first upper structure 4r. A sum of the stress relieving ability of the first lower structure 7r and the stress relieving ability of the second lower structure 8r is less than a sum of the stress relieving ability of the first upper structure 4r and the stress relieving ability of the second upper structure 5r.

As shown in FIG. 28 and FIG. 29, a first lower occupancy ratio is defined as a ratio of an area of a solid portion of the first lower structure 7r (e.g., the lower stress relief structure) from a bottom view to an area of the entire first lower region 61r from a bottom view. A second lower occupancy ratio is defined as a ratio of an area of a solid portion of the second lower structure 8r (e.g., the lower reinforcing structure) from a bottom view to an area of the entire second lower region 62r from a bottom view. The second lower occupancy ratio may be greater than the first lower occupancy ratio. In one embodiment, the first lower structure 7r (e.g., the lower stress relief structure) includes copper; thus, the first lower occupancy ratio is a first lower residual copper ratio. Similarly, the second lower structure 8r (e.g., the lower reinforcing structure) includes copper; thus, the second lower occupancy ratio is a second lower residual copper ratio. Therefore, the second lower residual copper ratio of the second lower structure 8r (e.g., the lower reinforcing structure) is greater than the first lower residual copper ratio of the first lower structure 7r (e.g., the lower stress relief structure). In one embodiment, the second lower occupancy ratio (or the second lower residual copper ratio) of the second lower structure 8r (e.g., the lower reinforcing structure) may be greater than 80% or 90%, or equal to 100%.

The lower side rail 6r may have a width $W_{17}$. The first lower region 61r may have a width $W_{18}$. The second lower region 62r may have a width $W_{19}$. The width $W_{19}$ of the second lower region 62r may be greater than the width $W_{18}$ of the first lower region 61r. For example, the width $W_{18}$ of the first lower region 61r may be ⅓ of the width $W_{17}$ of the lower side rail 6r, and the width $W_{19}$ of the second lower region 62r may be ⅔ of the width $W_{17}$ of the lower side rail 6r. For example, a ratio of the width $W_{19}$ of the second lower region 62r to the width $W_{18}$ of the first lower region 61r is about two to about four.

As shown in FIG. 28 and FIG. 29, a size of the lower side rail 6r is substantially equal to a size of the upper side rail 3r. However, a size (width $W_{18}$) of the first lower region 61r may be less than a size (width $W_{15}$) of the first upper region 31r.

In the embodiment illustrated in FIG. 24 to FIG. 29, an upper overall residual metal ratio is defined as a ratio of an area of the upper metal layer 16 (including the upper circuit layer 12, the first upper structure 4r (e.g., the upper stress relief structure) and the second upper structure 5r (e.g., the upper reinforcing structure)) from a top view to an area of the entire upper surface 101 of the main body 10. Since the upper metal layer 16 may include copper; thus, the upper overall residual metal ratio is an upper overall residual copper ratio. It is noted that the upper overall residual metal ratio (e.g., the upper overall residual copper ratio) may be adjusted by adjusting the first upper occupancy ratio (the first upper residual copper ratio) of the first upper structure 4r (e.g., the upper stress relief structure) and the second upper occupancy ratio (the second upper residual copper ratio) of the second upper structure 5 (e.g., the upper reinforcing structure). Similarly, a lower overall residual metal ratio is defined as a ratio of an area of the lower metal layer 17 (including the lower circuit layer 14, the first lower structure 7r (e.g., the lower stress relief structure) and the second lower structure 8r (e.g., the lower reinforcing structure)) from a bottom view to an area of the entire lower surface 102 of the main body 10. Since the lower metal layer 17 may include copper; thus, the lower overall residual metal ratio is a lower overall residual copper ratio. It is noted that the lower overall residual metal ratio (e.g., the lower overall residual copper ratio) may be adjusted by adjusting the first lower occupancy ratio (the first lower residual copper ratio) of the first lower structure 7r (e.g., the lower stress relief structure) and the second lower occupancy ratio (the second lower residual copper ratio) of the second lower structure 8r (e.g., the lower reinforcing structure). The lower overall residual metal ratio may be greater than the upper overall residual metal ratio, so as to reduce the convex warpage (or crying face warpage) of the substrate structure 1r. In one embodiment, a difference between the upper overall residual metal ratio and the lower overall residual metal ratio may be adjusted to be less than or equal to about 20%, about 15%, about 10%, or about 5%.

Figure 30:
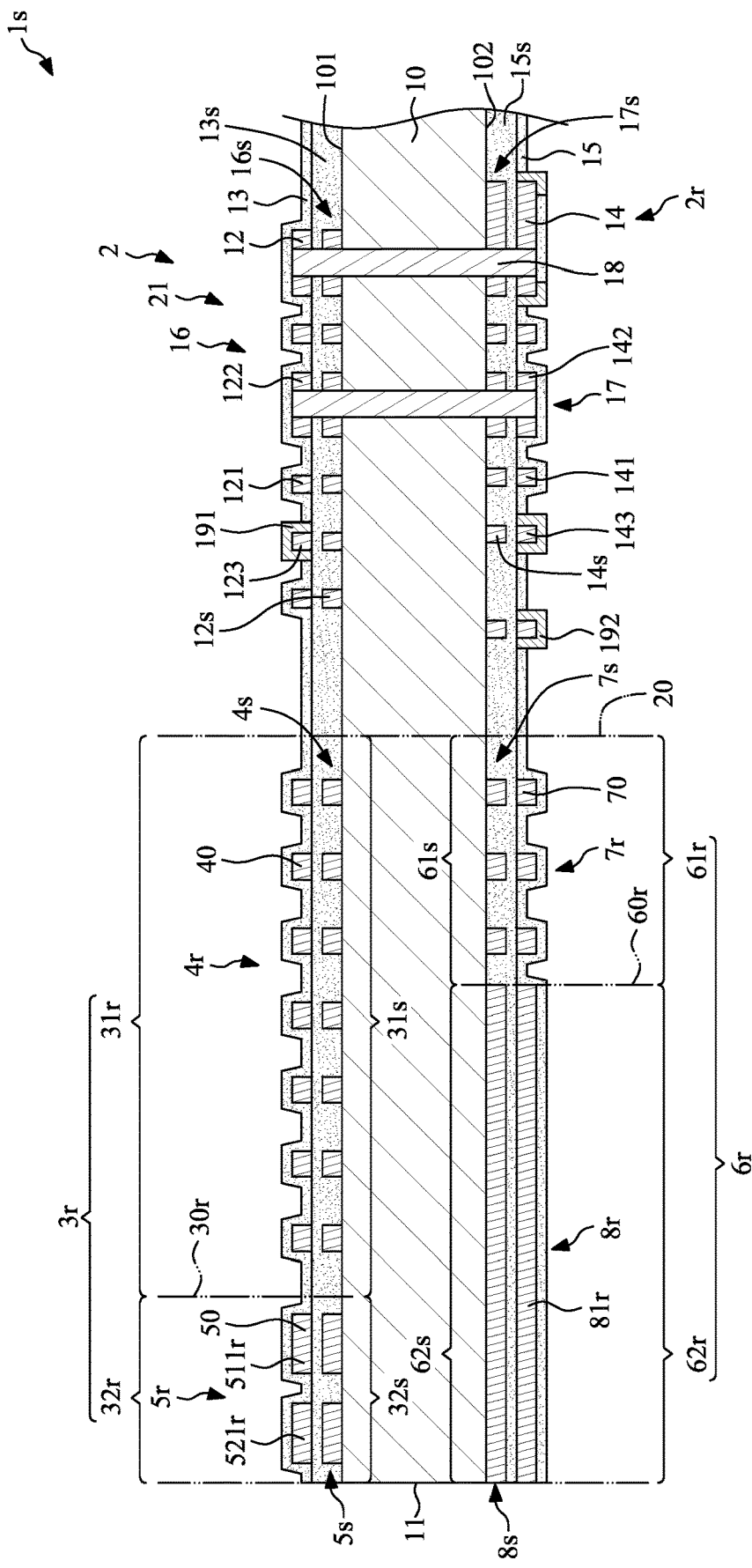
FIG. 30 illustrates an enlarged cross-sectional view of a substrate structure in accordance with some embodiments of the present disclosure.

FIG. 30 illustrates an enlarged cross-sectional view of a substrate structure is in accordance with some embodiments of the present disclosure. The substrate structure 1s is similar to the substrate structure 1r in FIG. 24 to FIG. 29 except that a first inner metal layer 16s, a first dielectric layer 13s, a second inner metal layer 17s and a second dielectric layer 15s are further included. The first inner metal layer 16s is disposed on the upper surface 101 of the main body 10, and the first dielectric layer 13s covers the first inner metal layer 16s. The upper metal layer 16 and the upper solder resist layer 13 are disposed on the first dielectric layer 13s. The second inner metal layer 17s is disposed on the lower surface 102 of the main body 10, and the second dielectric layer 15s covers the second inner metal layer 17s. The lower metal layer 17 and the lower solder resist layer 15 are disposed on the second dielectric layer 15s.

The first inner metal layer 16s includes an upper circuit layer 12s, a third upper structure 4s and a fourth upper structure 5s. A pattern of the upper circuit layer 12s may be similar to a pattern of the upper circuit layer 12 of the upper metal layer 16. The third upper structure 4s is disposed in a third upper region 31s, and a pattern of the third upper structure 4s is similar to a pattern of the first upper structure 4r. A size (width) of the third upper region 31s may be equal to a size (width) of the first upper region 31r. The fourth upper structure 5s is disposed in a fourth upper region 32s, and a pattern of the fourth upper structure 5s is similar to a pattern of the second upper structure 5r. A size (width) of the fourth upper region 32s may be equal to a size (width) of the second upper region 32r.

The second inner metal layer 17s includes a lower circuit layer 14s, a third lower structure 7s and a fourth lower structure 8s. A pattern of the lower circuit layer 14s may be similar to a pattern of the lower circuit layer 14 of the lower metal layer 17. The third lower structure 7s is disposed in a third lower region 61s, and a pattern of the third lower structure 7s is similar to a pattern of the first lower structure 7r. A size (width) of the third lower region 61s may be equal to a size (width) of the first lower region 61r. The fourth lower structure 8s is disposed in a fourth lower region 62s, and a pattern of the fourth lower structure 8s is similar to a pattern of the second lower structure 8r. A size (width) of the fourth lower region 62s may be equal to a size (width) of the second lower region 62r.

Figure 31:
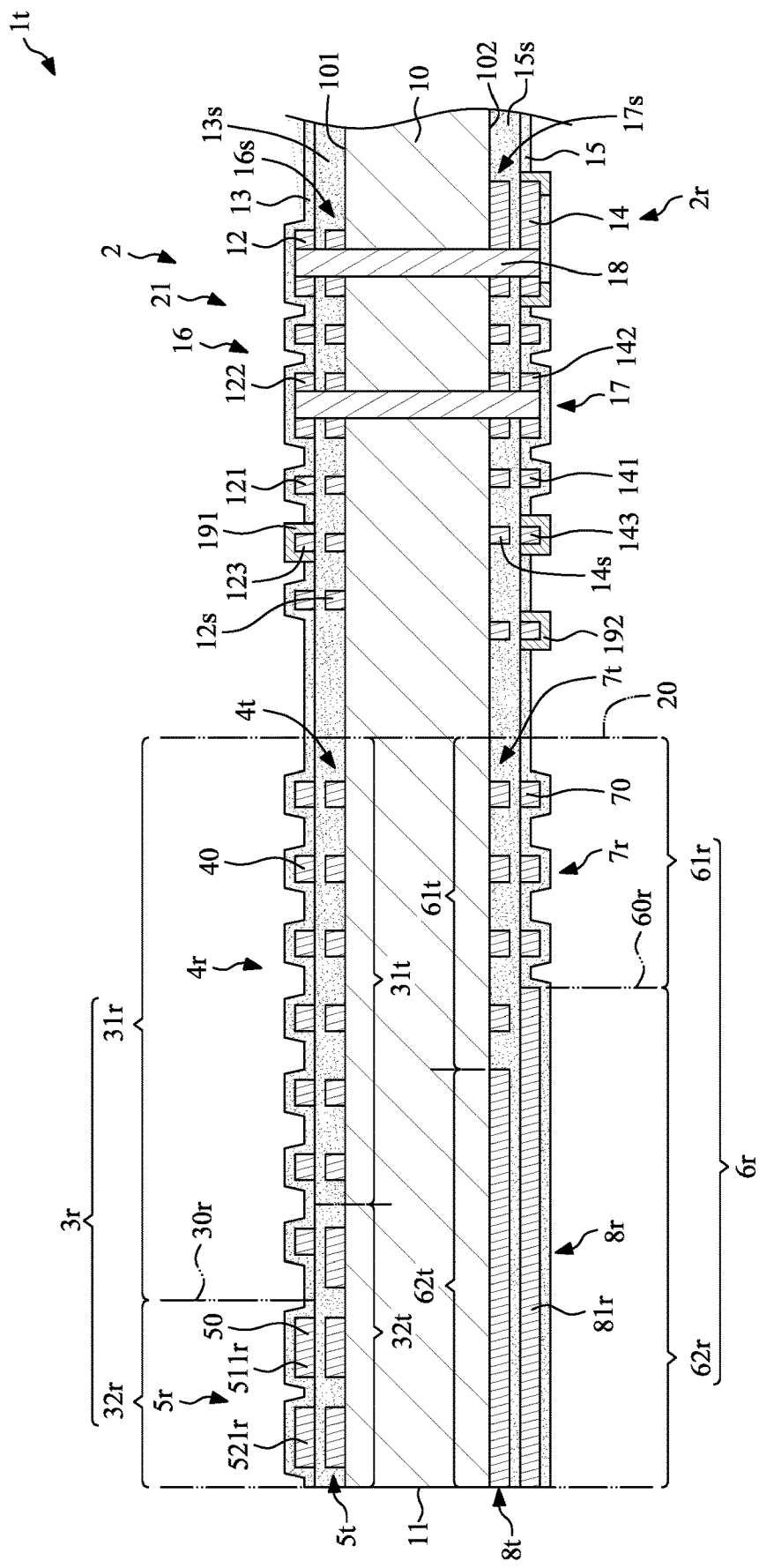
FIG. 31 illustrates an enlarged cross-sectional view of a substrate structure in accordance with some embodiments of the present disclosure.

FIG. 31 illustrates an enlarged cross-sectional view of a substrate structure 1t in accordance with some embodiments of the present disclosure. The substrate structure 1t is similar to the substrate structure 1s in FIG. 30 except for the structures of the third upper structure 4t, the fourth upper structure 5t, the third lower structure 7t and the fourth lower structure 8t. The third upper structure 4t is disposed in a third upper region 31t, and a pattern of the third upper structure 4t is similar to a pattern of the first upper structure 4t. A size (width) of the third upper region 31t may be less than the size (width) of the first upper region 31r. The fourth upper structure 5t is disposed in a fourth upper region 32t, and a pattern of the fourth upper structure 5t is similar to a pattern of the second upper structure 5t or the pattern of the second structure 5 of FIG. 1 to FIG. 6. A size (width) of the fourth upper region 32t may be greater than the size (width) of the second upper region 32r.

The third lower structure 7t is disposed in a third lower region 61t, and a pattern of the third lower structure 7t is similar to a pattern of the first lower structure 7r. A size (width) of the third lower region 61t may be greater than the size (width) of the first lower region 61r. The fourth lower structure 8t is disposed in a fourth lower region 62t, and a pattern of the fourth lower structure 8t is similar to a pattern of the second lower structure 8r. A size (width) of the fourth lower region 62t may be less than the size (width) of the second lower region 62r. In some embodiments, the size (width) of the third lower region 61t may be less than the size (width) of the third upper region 31t.

FIG. 32 through FIG. 36 illustrate a method for manufacturing a semiconductor package according to some embodiments of the present disclosure. In some embodiments, the method is for manufacturing the semiconductor package 9 (FIG. 36) including the substrate structure 1.

Referring to FIG. 32, a substrate structure 1 is provided. The substrate structure 1 is substantially same as the substrate structure 1 shown in FIG. 1 to FIG. 6. The substrate structure 1 includes a chip attach area 2 and an upper side rail 3 surrounding the chip attach area 2. The upper side rail 3 includes a first structure 4 (e.g., an upper stress relief structure) and a second structure 5 (e.g., an upper reinforcing structure). The first structure 4 (e.g., an upper stress relief structure) surrounds the chip attach area 2, and the second structure 5 (e.g., an upper reinforcing structure) surrounds the first structure 4 (e.g., an upper stress relief structure). A stress relieving ability of the first structure 4 (e.g., an upper stress relief structure) is greater than a stress relieving ability of the second structure 5 (e.g., an upper reinforcing structure). A structural strength of the second structure 5 (e.g., an upper reinforcing structure) is greater than a structural strength of the first structure 4 (e.g., an upper stress relief structure). In some embodiments, the substrate structure 1 may be replace by the substrate structures 1a, 1b, 1c, 1d, 1e, 1f, 1g, 1h, 1i, 1j, 1k, 1m, 1n, 1p, 1q, 1r, 1s, 1t of FIG. 7 to FIG. 31.

Then, at least one semiconductor chip 92 is attached to the chip attach area 2. As shown in FIG. 32, the semiconductor chip 92 is electrically connected to the substrate structure 1 by wire bonding. That is, a backside of the semiconductor chip 92 is adhered to the upper solder resist layer 13 on the upper surface 101 of the main body 10, and an active surface of the semiconductor chip 92 is electrically connected to the upper surface finish layer 191 on the conductive fingers 123 of the upper circuit layer 12 through a plurality of bonding wires 94. In other embodiments, the semiconductor chip 92 may be electrically connected to the substrate structure 1 by flip-chip bonding.

Figure 33:
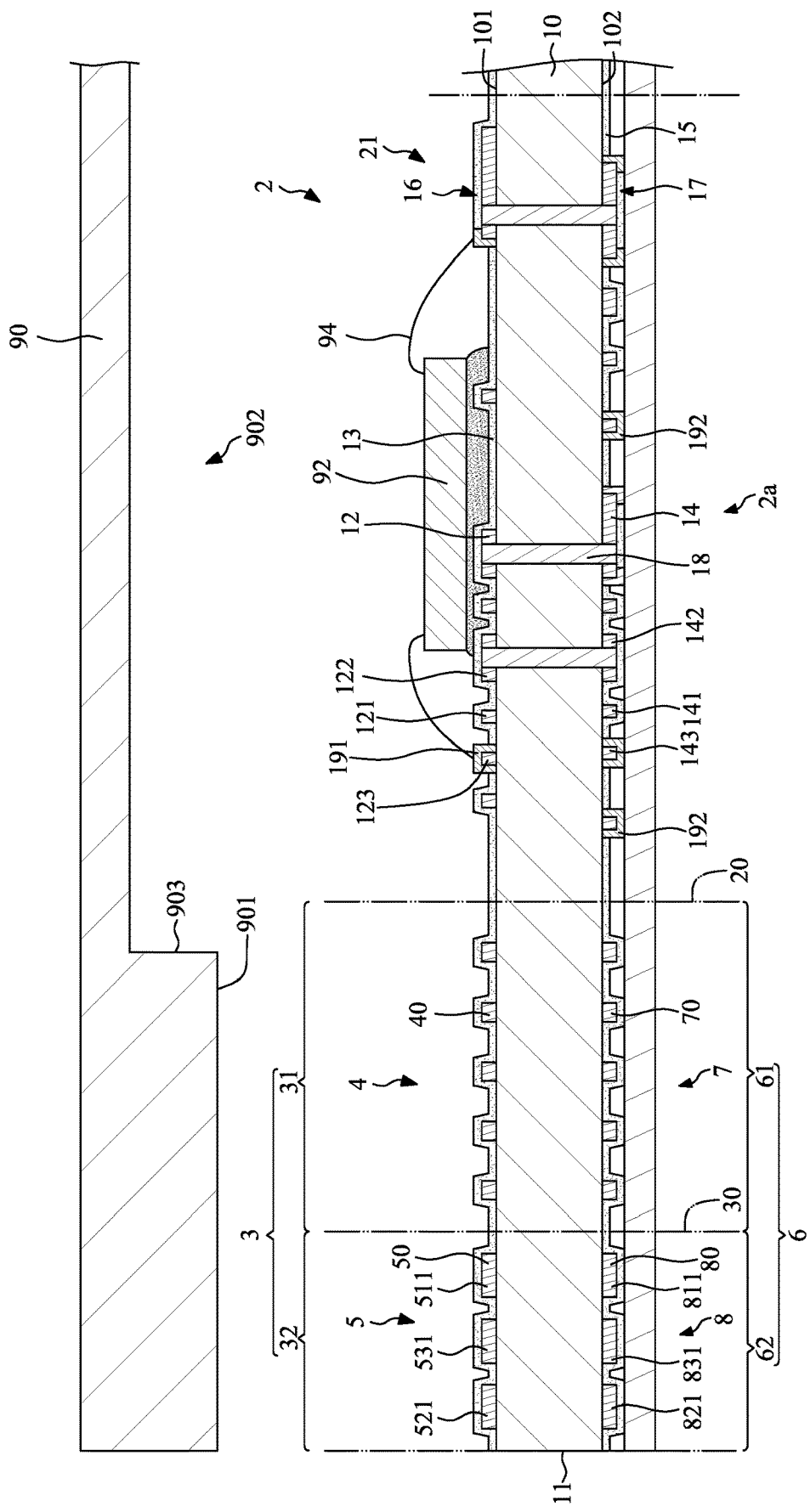
FIG. 33 illustrates one or more stages of an example of a method for manufacturing a semiconductor package according to some embodiments of the present disclosure.

Referring to FIG. 33, a molding mold 90 is provided. The molding mold 90 has a bottom surface 901 and an inner lateral surface 903. The inner lateral surface 903 defines a mold cavity 902. The inner lateral surface 903 may be aligned with the first boundary line 20. Alternatively, the inner lateral surface 903 may be aligned with a position within the first region 31.

Figure 34:
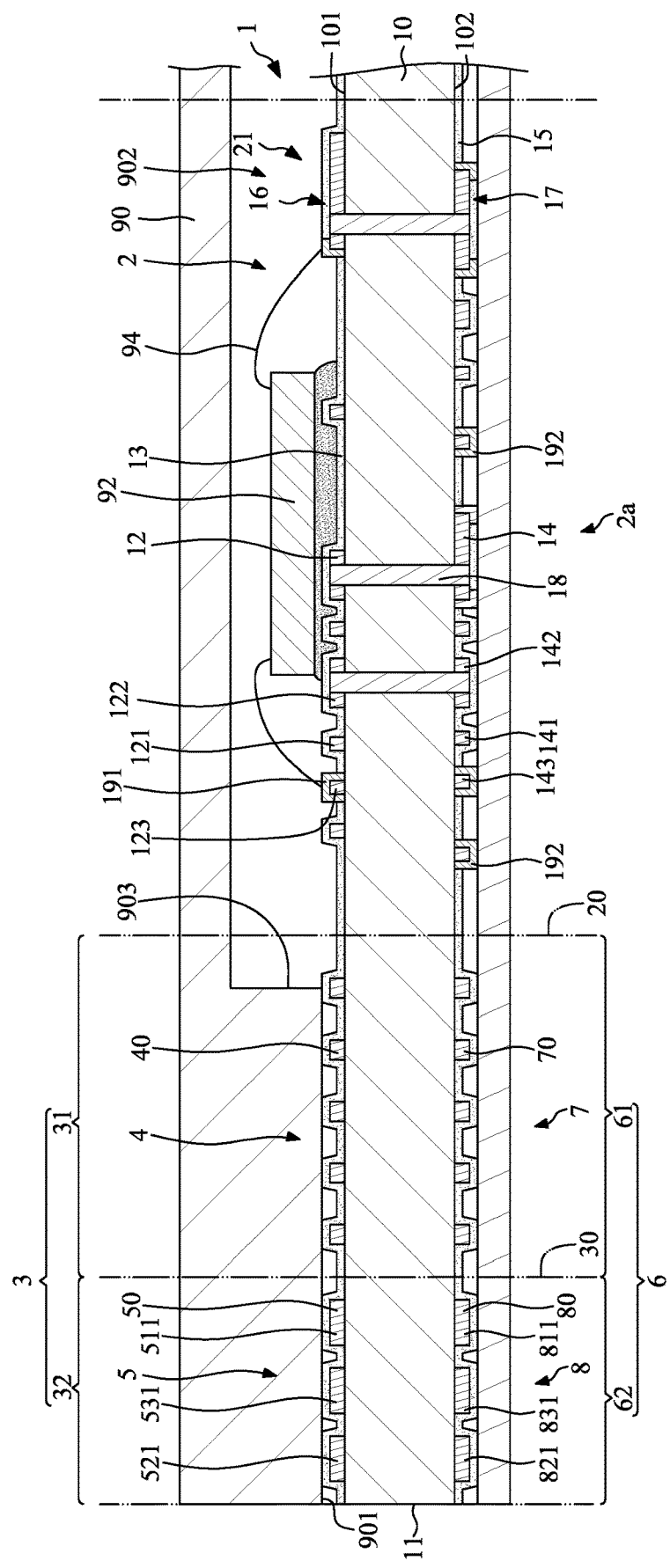
FIG. 34 illustrates one or more stages of an example of a method for manufacturing a semiconductor package according to some embodiments of the present disclosure.

Referring to FIG. 34, the bottom surface 901 of the molding mold 90 is pressed against the upper side rail 3 of the substrate structure 1. Thus, the chip attach area 2, the semiconductor chip 92 and the bonding wires 94 are accommodated in the mold cavity 902. In other words, the first structure 4 (e.g., an upper stress relief structure), the second structure 5 (e.g., an upper reinforcing structure) and the first solder resist layer 13 on the first structure 4 and the second structure 5 are tightly pressed by the bottom surface 901 of the molding mold 90, so that the mold cavity 902 forms an enclosed space. In some embodiments that the first solder resist layer 13 does not cover the first structure 4 and/or the second structure 5, the bottom surface 901 of the molding mold 90 may press the first structure 4 and/or the second structure 5 directly.

Figure 35:
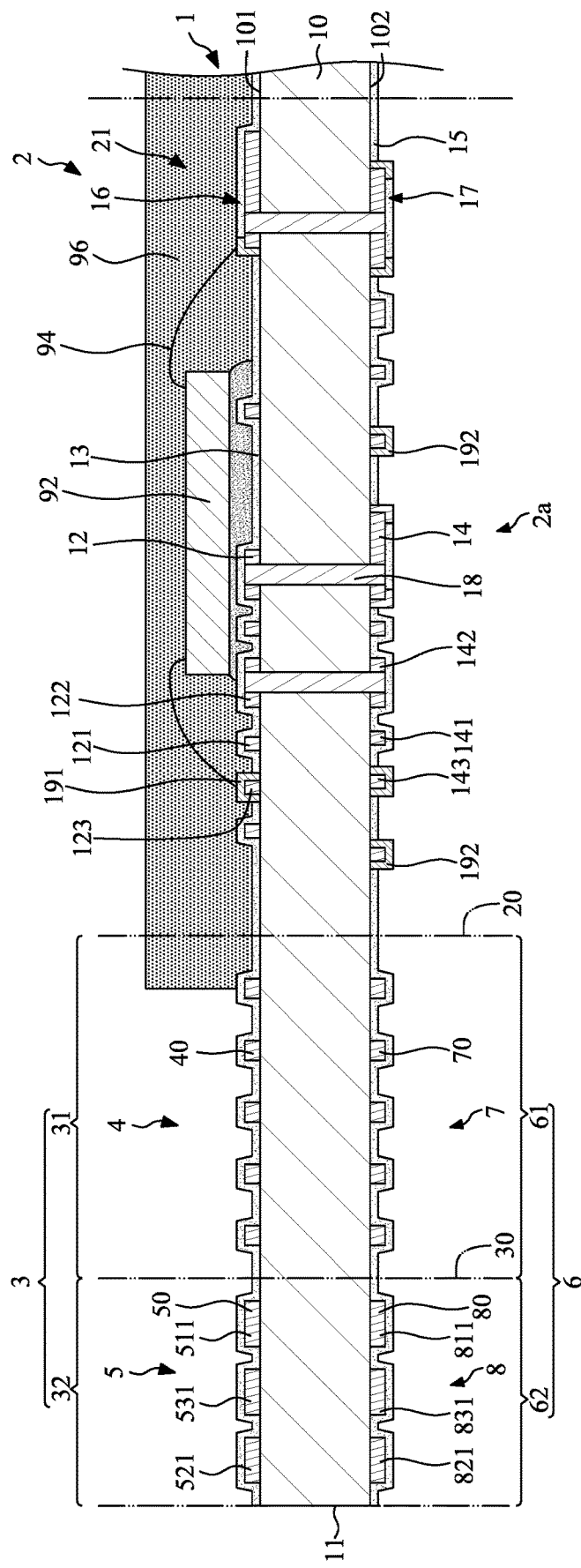
FIG. 35 illustrates one or more stages of an example of a method for manufacturing a semiconductor package according to some embodiments of the present disclosure.

Referring to FIG. 35, an encapsulant 96 (e.g., a molding compound) is formed or filled in the mold cavity 902 to cover the chip attach area 2, the semiconductor chip 92 and the bonding wires 94. During the molding process, the pattern of the first structure 4 (e.g., an upper stress relief structure) may prevent the encapsulant 96 from overflowing. Then, the encapsulant 96 is cured. Then, the molding mold 90 is removed.

Figure 36:
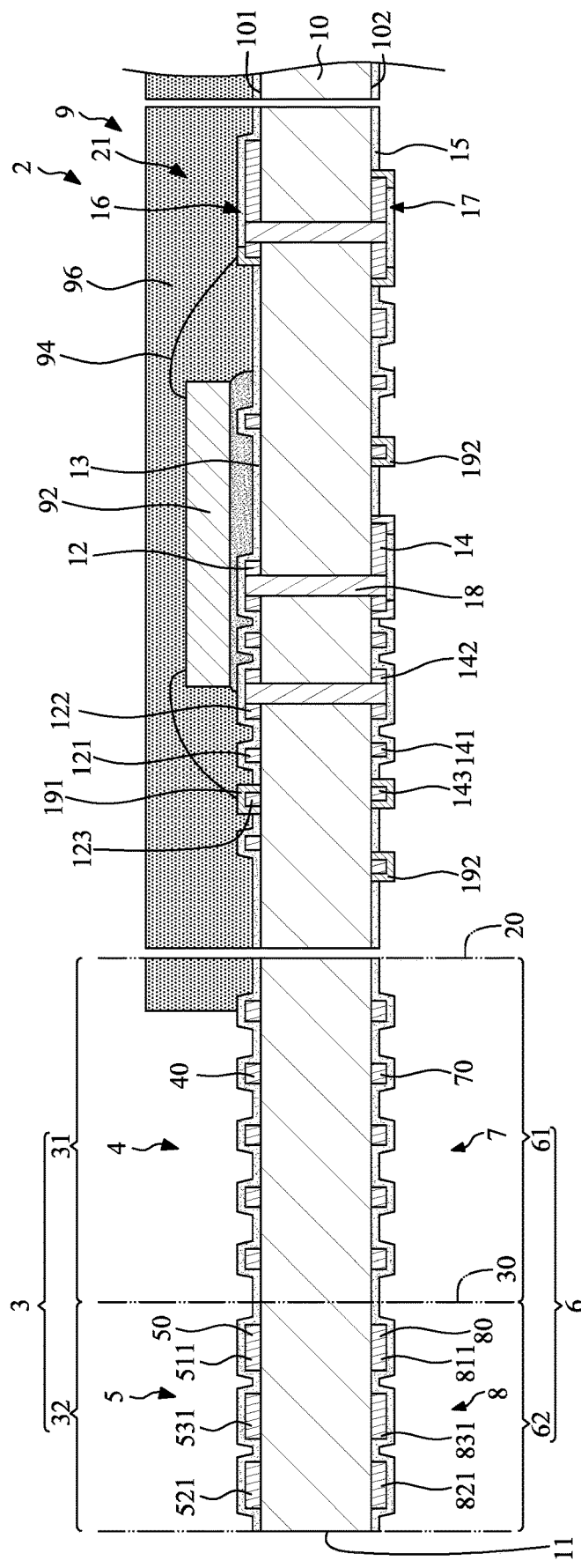
FIG. 36 illustrates one or more stages of an example of a method for manufacturing a semiconductor package according to some embodiments of the present disclosure.

Referring to FIG. 36, a singulation process is conducted along the first boundary line 20 so as to form a plurality of semiconductor packages 9. Each of the semiconductor packages 9 includes each of the unit areas 21. In addition, the upper side rail 3 (and the lower side rail 6) is disregarded.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within 50 μm of lying along a same plane, such as within 40 μm, within 30 μm, within 20 μm, within 10 μm, or within 1 μm of lying along the same plane. Two components can be deemed to be "substantially aligned" if, for example, the two components overlap or are within 200 μm, within 150 μm, within 100 μm, within 50 μm, within 40 μm, within 30 μm, within 20 μm, within 10 μm, or within 1 μm of overlapping. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A method for manufacturing a semiconductor package, comprising:
    (a) providing a substrate structure, wherein the substrate structure includes a chip attach area, an upper side rail surrounding the chip attach area, a first upper structure, a second upper structure, a bottom area opposite to the chip attach area, a lower side rail surrounding the bottom area, a first lower structure and a second lower structure, wherein the first upper structure is disposed in a first upper region of the upper side rail, the second upper structure is disposed in a second upper region surrounding the first upper region, the first lower structure is disposed in a first lower region of the lower side rail, the second lower structure is disposed in a second lower region surrounding the first lower region, wherein a stress relieving ability of the first lower structure is less than a stress relieving ability of the first upper structure, and a structural strength of the second lower structure is greater than a structural strength of the second upper structure;
    (b) attaching at least one semiconductor chip to the chip attach area; and
    (c) forming an encapsulant to cover the at least one semiconductor chip.

2. The method of claim 1, wherein in (a), a sum of the structural strength of the second lower structure and a structural strength of the first lower structure is greater than a sum of the structural strength of the second upper structure and a structural strength of the first upper structure, and a sum of the stress relieving ability of the first lower structure and a stress relieving ability of the second lower structure is less than a sum of the stress relieving ability of the first upper structure and a stress relieving ability of the second upper structure.

3. The method of claim 1, wherein in (b), the at least one semiconductor chip is electrically connected to the substrate structure by wire bonding or flip-chip bonding.

4. The method of claim 1, wherein in (a), a width of the upper side rail is equal a width of the lower side rail.

5. The method of claim 1, wherein after (c), the method further comprises:
    (d) conducting a singulation process.

6. The method of claim 5, wherein in (d), the upper side rail and the lower side rail are disregarded.

7. A substrate structure comprising:
    a first lower structure disposed in a first lower region surrounding a bottom area opposite to a chip attach area, wherein a first lower occupancy ratio is defined as a ratio of an area of the first lower structure from a bottom view to an area of the entire first lower region from a bottom view; and
    a second lower structure disposed in a second lower region surrounding the first lower region, wherein a second lower occupancy ratio is defined as a ratio of an area of the second lower structure from a bottom view to an area of the entire second lower region from a bottom view, and the second lower occupancy ratio is greater than the first lower occupancy ratio,
    wherein a stress relieving ability of the first lower structure is greater than a stress relieving ability of the second lower structure, and a structural strength of the second lower structure is greater than a structural strength of the first lower structure.

8. The substrate structure of claim 7, wherein the first lower structure includes a plurality of strips cross with each other to form a net shape.

9. The substrate structure of claim 7, wherein the second lower structure includes at least one row of segments.

10. The substrate structure of claim 7, wherein the second lower region is full of a metal material, and the second lower structure is in a continuous ring shape from a bottom view.

11. The substrate structure of claim 7, wherein a width of the second lower region is greater than a width of the first lower region.

12. The substrate structure of claim 11, wherein a ratio of the width of the second lower region to the width of the first lower region is about two to about four.

13. The substrate structure of claim 7, further comprising:
    a first upper structure disposed in a first upper region surrounding the chip attach area, wherein a first upper occupancy ratio is defined as a ratio of an area of the first upper structure from a top view to an area of the entire first upper region from a top view; and
    a second upper structure disposed in a second upper region surrounding the first upper region, wherein a second upper occupancy ratio is defined as a ratio of an area of the second upper structure from a top view to an area of the entire second upper region from a top view, and the second upper occupancy ratio is greater than the first upper occupancy ratio.

14. The substrate structure of claim 13, wherein the first upper structure includes a plurality of strips cross with each other to form a net shape, and the second upper structure includes at least one row of segments.

15. The substrate structure of claim 13, wherein a width of the first upper region is greater than a width of the second upper region.

16. The substrate structure of claim 7, wherein the chip attach area includes a plurality of chip regions, and a ratio of a sum of the areas of the chip regions from a top view to an area of the entire substrate structure from a top view is greater than 40%.

17. A substrate structure comprising:
   a first lower structure disposed in a first lower region surrounding a bottom area opposite to a chip attach area; and
   a second lower structure disposed in a second lower region surrounding the first lower region, wherein a width of the second lower region is greater than a width of the first lower region, a second lower occupancy ratio is defined as a ratio of an area of the second lower structure from a bottom view to an area of the entire second lower region from a bottom view, and the second lower occupancy ratio is greater than 80%
   wherein a stress relieving ability of the first lower structure is greater than a stress relieving ability of the second lower structure, and a structural strength of the second lower structure is greater than a structural strength of the first lower structure.

18. The substrate structure of claim 17, wherein the second lower region is full of a metal material.

19. The substrate structure of claim 17, wherein the second lower structure is in a continuous ring shape from a bottom view.

20. The substrate structure of claim 17, wherein the first lower structure includes a plurality of strips 70 cross with each other to form a net shape.

* * * * *